US012757720B2

(12) United States Patent
Sung et al.

(10) Patent No.: US 12,757,720 B2
(45) Date of Patent: Oct. 6, 2026

(54) SEMICONDUCTOR DEVICE AND ELECTRONIC SYSTEM INCLUDING THE SAME

(71) Applicant: SAMSUNG ELECTRONICS CO., LTD., Suwon-si (KR)

(72) Inventors: Jungtae Sung, Suwon-si (KR); Yunsun Jang, Suwon-si (KR); Moorym Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 860 days.

(21) Appl. No.: 18/080,402

(22) Filed: Dec. 13, 2022

(65) Prior Publication Data

US 2023/0317607 A1 Oct. 5, 2023

(30) Foreign Application Priority Data

Mar. 30, 2022 (KR) ........................ 10-2022-0039703

(51) Int. Cl.
*H10B 41/35* (2023.01)
*H10B 41/41* (2023.01)
(Continued)

(52) U.S. Cl.
CPC .......... *H10W 20/435* (2026.01); *H10B 41/35* (2023.02); *H10B 41/41* (2023.02);
(Continued)

(58) Field of Classification Search
CPC ............... H10W 20/435; H10W 20/42; H10W 20/4403; H10W 70/20; H10B 41/35;
(Continued)

(56) References Cited

U.S. PATENT DOCUMENTS 9,449,987 B1 * 9/2016 Miyata .................. H10B 43/10
10,115,667 B2 * 10/2018 Yun ........................ H10B 43/40
(Continued)

FOREIGN PATENT DOCUMENTS

KR 10-2015-0126524 A 11/2015
KR 10-2018-0042358 A 4/2018
KR 10-2021-0025032 A 3/2021

OTHER PUBLICATIONS

Office Action issued Jan. 9, 2026 by the Korean Ministry of Intellectual Property for KR Patent Application No. 10-2022-0039703.

*Primary Examiner* — Eugene Lee
(74) *Attorney, Agent, or Firm* — Sughrue Mion, PLLC

(57) ABSTRACT

A semiconductor device includes a first semiconductor structure including a lower bonding structure, and a second semiconductor structure including a second substrate disposed on the first semiconductor structure, gate electrodes stacked and spaced apart from each other in a first direction perpendicular to a lower surface of the second substrate, an upper bonding structure bonded to the lower bonding structure, a plate conductive layer disposed on an upper surface of the second substrate, electrically connected to a channel layer, and including a metal material, and an isolation structure penetrating an entirety of the gate electrodes and extending in a second direction perpendicular to the first direction. The isolation structure includes a vertical conductive layer that extends from and is integrated with the plate conductive layer, and that includes a same metal material as the metal material of the plate conductive layer.

13 Claims, 23 Drawing Sheets

(51) Int. Cl.

| | |
|---|---|
| ***H10B 43/35*** | (2023.01) |
| ***H10B 43/40*** | (2023.01) |
| ***H10D 30/68*** | (2025.01) |
| ***H10D 30/69*** | (2025.01) |
| ***H10D 62/13*** | (2025.01) |
| ***H10D 62/17*** | (2025.01) |
| ***H10W 20/41*** | (2026.01) |
| ***H10W 20/42*** | (2026.01) |
| ***H10W 20/44*** | (2026.01) |
| ***H10W 70/20*** | (2026.01) |
| *H10W 90/00* | (2026.01) |
| *H10W 90/20* | (2026.01) |
| *H10W 90/24* | (2026.01) |

(52) U.S. Cl.

CPC ............. *H10B 43/35* (2023.02); *H10B 43/40* (2023.02); *H10D 30/6892* (2025.01); *H10D 30/696* (2025.01); *H10D 62/151* (2025.01); *H10D 62/235* (2025.01); *H10W 20/42* (2026.01); *H10W 20/4403* (2026.01); *H10W 70/20* (2026.01); *H10W 90/00* (2026.01); *H10W 90/20* (2026.01); *H10W 90/24* (2026.01); *H10W 90/701* (2026.01); *H10W 90/752* (2026.01); *H10W 90/754* (2026.01); *H10W 90/792* (2026.01)

(58) Field of Classification Search

CPC ........ H10B 41/41; H10B 43/35; H10B 43/40; H10D 30/6892; H10D 30/696; H10D 62/151; H10D 62/235; H01L 23/5283; H01L 23/492; H01L 23/5226; H01L 23/53209; H01L 24/08

See application file for complete search history.

(56) References Cited

U.S. PATENT DOCUMENTS

| | | | | |
|---|---|---|---|---|
| 10,147,732 | B1 | 12/2018 | Hu et al. | |
| 10,867,678 | B2 | 12/2020 | Chen et al. | |
| 10,978,428 | B2 | 4/2021 | Kim | |
| 2012/0181602 | A1* | 7/2012 | Fukuzumi .............. | H10B 43/27 257/326 |
| 2014/0141610 | A1 | 5/2014 | Jin et al. | |
| 2016/0079164 | A1* | 3/2016 | Fukuzumi .............. | H10B 43/30 438/107 |
| 2016/0329341 | A1* | 11/2016 | Shimabukuro ........ | H10B 41/35 |
| 2019/0081069 | A1* | 3/2019 | Lu .......................... | H10D 88/00 |
| 2019/0312012 | A1* | 10/2019 | Tagami .................. | H10B 41/27 |
| 2020/0203329 | A1* | 6/2020 | Kanamori .............. | H10D 88/00 |
| 2020/0286842 | A1* | 9/2020 | Sanuki .................... | H01L 24/09 |
| 2020/0357784 | A1* | 11/2020 | Park ....................... | H10B 41/50 |
| 2020/0402923 | A1* | 12/2020 | Shim ...................... | H10B 43/40 |
| 2021/0005593 | A1* | 1/2021 | Lee ........................ | H10B 43/27 |
| 2021/0036002 | A1 | 2/2021 | Lee et al. | |
| 2021/0074717 | A1* | 3/2021 | Lim ....................... | H10B 43/50 |
| 2021/0111137 | A1* | 4/2021 | Chen ..................... | H01L 23/528 |
| 2021/0134819 | A1* | 5/2021 | Zhang ................... | H01L 23/481 |
| 2021/0217768 | A1 | 7/2021 | Fukuzumi et al. | |
| 2021/0217769 | A1 | 7/2021 | Lee | |
| 2021/0383874 | A1* | 12/2021 | Oh ......................... | H10B 43/27 |
| 2022/0045035 | A1* | 2/2022 | Park ....................... | H10B 41/27 |
| 2022/0093639 | A1* | 3/2022 | Song ...................... | H10B 41/27 |
| 2023/0013984 | A1* | 1/2023 | Otsu ...................... | H10B 41/27 |

* cited by examiner

SEMICONDUCTOR DEVICE AND ELECTRONIC SYSTEM INCLUDING THE SAME

CROSS-REFERENCE TO RELATED APPLICATION(S)

This application claims benefit of priority to Korean Patent Application No. 10-2022-0039703 filed on Mar. 30, 2022 in the Korean Intellectual Property Office, the disclosure of which is herein incorporated by reference in its entirety.

BACKGROUND

Example embodiments of the present disclosure relate to a semiconductor device and an electronic system including the same.

A semiconductor device storing high-capacity data in an electronic system requiring data storage has been necessary. Accordingly, a method for increasing a data storage capacity of a semiconductor device has been studied. For example, as one of methods for increasing the data storage capacity of a semiconductor device, a semiconductor device including memory cells arranged three-dimensionally, instead of memory cells arranged two-dimensionally, has been suggested.

SUMMARY

It is an aspect to provide a semiconductor device having improved electrical properties and improved reliability.

It is another aspect to provide an electronic system including a semiconductor device.

According to an aspect of one or more embodiments, there is provided a semiconductor device includes a first semiconductor structure including a first substrate, circuit devices disposed on the first substrate, a lower wiring structure electrically connected to the circuit devices, and a lower bonding structure connected to the lower wiring structure; and a second semiconductor structure including a second substrate disposed on the first semiconductor structure, gate electrodes stacked and spaced apart from each other in a first direction perpendicular to a lower surface of the second substrate, channel structures penetrating the gate electrodes, extending in the first direction, and each including a channel layer, an upper wiring structure disposed below the gate electrodes and the channel structures, an upper wiring structure disposed below the gate electrodes and below the channel structures, an upper bonding structure connected to the upper wiring structure and bonded to the lower bonding structure, a plate conductive layer disposed on an upper surface of the second substrate, electrically connected to the channel layer, and including a metal material, and an isolation structure penetrating an entirety of the gate electrodes and extending in a second direction perpendicular to the first direction, wherein the isolation structure includes a vertical conductive layer that extends from the plate conductive layer, that is integrated with the plate conductive layer, and that includes a same metal material as the metal material of the plate conductive layer.

According to another aspect of one or more embodiments, there is provided a semiconductor device includes a first substrate; circuit devices disposed on the first substrate; a lower wiring structure electrically connected to the circuit devices; a lower bonding structure connected to the lower wiring structure; an upper bonding structure bonded to the lower bonding structure; an upper wiring structure connected to the upper bonding structure; a plate conductive layer that is disposed on the upper wiring structure and that includes a conductive material; gate electrodes stacked and spaced apart from each other in a first direction perpendicular to a lower surface of the plate conductive layer; channel structures penetrating through the gate electrodes and each including a channel layer; and an isolation structure that penetrates an entirety of the gate electrodes, that extends in a second direction perpendicular to the first direction, and that includes a vertical conductive layer, wherein the vertical conductive layer is in contact with the plate conductive layer and includes a conductive material that is a same conductive material as the conductive material of the plate conductive layer.

According to yet another aspect of one or more embodiments, there is provided an electronic system comprising a semiconductor device including a first substrate, circuit devices disposed on the first substrate, a lower wiring structure electrically connected to the circuit devices, a lower bonding structure connected to the lower wiring structure, an upper bonding structure bonded to the lower bonding structure, an upper wiring structure connected to the upper bonding structure, a plate conductive layer disposed on the upper wiring structure and including a conductive material, gate electrodes stacked and spaced apart from each other in a first direction perpendicular to a lower surface of the plate conductive layer, channel structures penetrating through the gate electrodes and each including a channel layer, an isolation structure penetrating an entirety of the gate electrodes, extending in a second direction perpendicular to the first direction, and including a vertical conductive layer, and an input/output pad electrically connected to the circuit devices through the upper wiring structure, the vertical conductive layer being in contact with the plate conductive layer and including a conductive material that is a same conductive material as the conductive material of the plate conductive layer; and a controller electrically connected to the semiconductor device through the input/output pad and configured to control the semiconductor device.

BRIEF DESCRIPTION OF DRAWINGS

The above and other aspects, features, and advantages of the present disclosure will be more clearly understood from the following detailed description, taken in combination with the accompanying drawings, in which.

DETAILED DESCRIPTION

Hereinafter, various embodiments will be described as follows with reference to the accompanying drawings.

Figure 1:
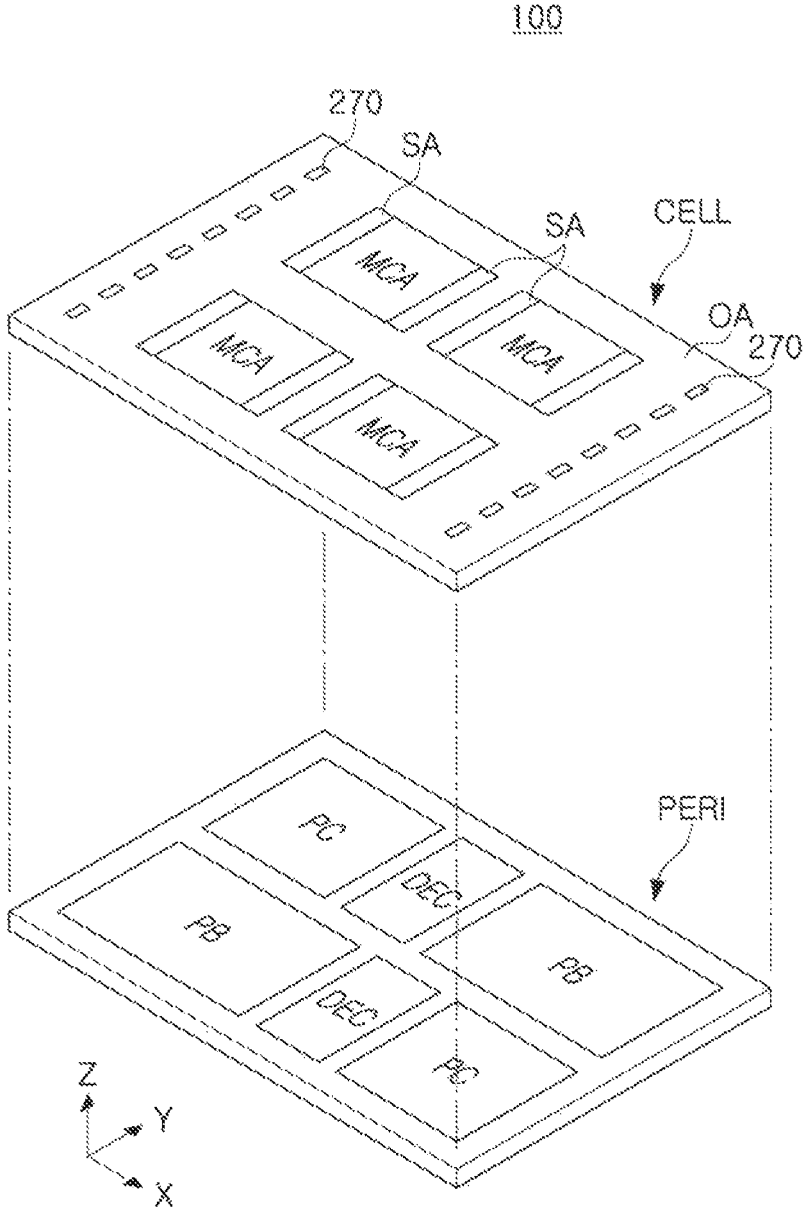
FIG. 1 is an exploded perspective diagram illustrating a semiconductor device according to an example embodiment.

FIG. 1 is an exploded perspective diagram illustrating a semiconductor device according to an example embodiment.

Referring to FIG. 1, a semiconductor device 100 according to some example embodiments may include a peripheral circuit region PERI and a memory cell region CELL stacked in a vertical direction. The peripheral circuit region PERI and the memory cell region CELL may be bonded to each other. The memory cell region CELL may include a memory cell array region MCA, a staircase region SA adjacent to the memory cell array region MCA, and an external side region OA on an external side of the memory cell array region MCA and the staircase region SA. A conductive pad 270 working as an input/output pad may be disposed in the external side region OA. A plurality of the memory cell array regions MCA with associated staircase regions SA may be disposed, as illustrated in the example of FIG. 1. However, the number of memory cell array regions MCA is not particularly limited and, in some embodiments, the number of memory cell array regions MCA may be less than or greater than the four that are illustrated in the example of FIG. 1. A plurality of the conductive pads 270 may be disposed.

The peripheral circuit region PERI may include a row decoder DEC, a page buffer PB, and other peripheral circuits PC. In the peripheral circuit region PERI, the row decoder DEC may decode an input address and may generate and transmit driving signals of a word line. The page buffer PB may be connected to the memory cell array region MCA through bit lines and may read information stored in the memory cells. The other peripheral circuits PC may be regions including a control logic and a voltage generator, and may include, for example, a latch circuit, a cache circuit, and/or a sense amplifier. The peripheral circuit region PERI may further include a pad region, and in this case, the pad region may include an electrostatic discharge (ESD) device or a data input/output circuit. The ESD device or a data input/output circuit of the pad region may be electrically connected to the conductive pad 270 of the external side region OA. The various circuit regions DEC, PB, and PC in the peripheral circuit region PERI may be arranged in various forms.

Hereinafter, an example of the semiconductor device 100 will be described with reference to FIG. 2.

Figure 2:
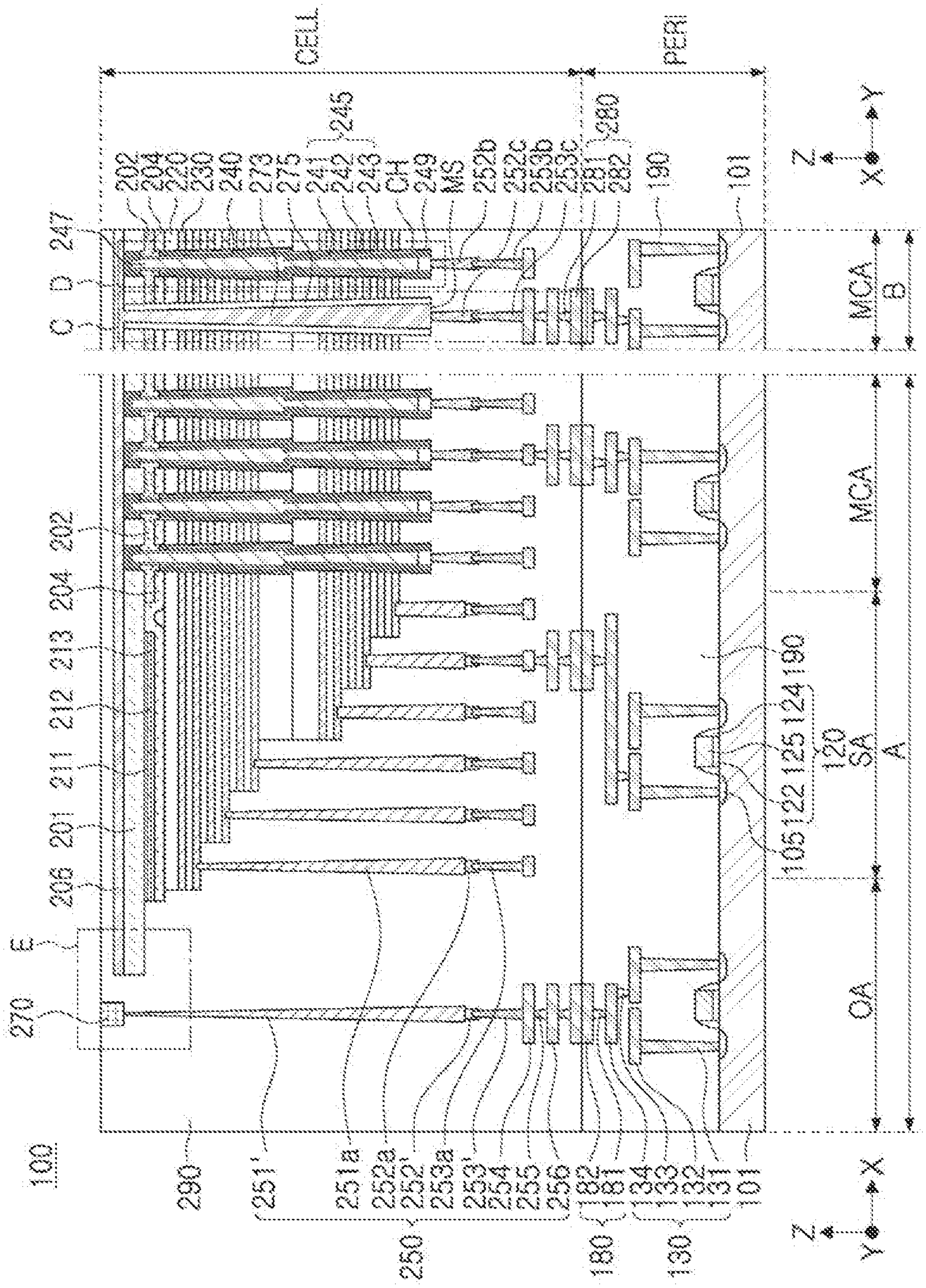
FIG. 2 is a cross-sectional diagram illustrating a semiconductor device according to an example embodiment.

FIG. 2 is a cross-sectional diagram illustrating a semiconductor device according to an example embodiment. In FIG. 2, region "A" represents a cross-section of the semiconductor device 100, a portion of the memory cell array region MCA and the staircase region SA illustrated in FIG. 1, in the x direction, and region "B" represents a cross-section of the semiconductor device 100, a portion of the memory cell array region MCA illustrated in FIG. 1, in the y direction.

Figure 3:
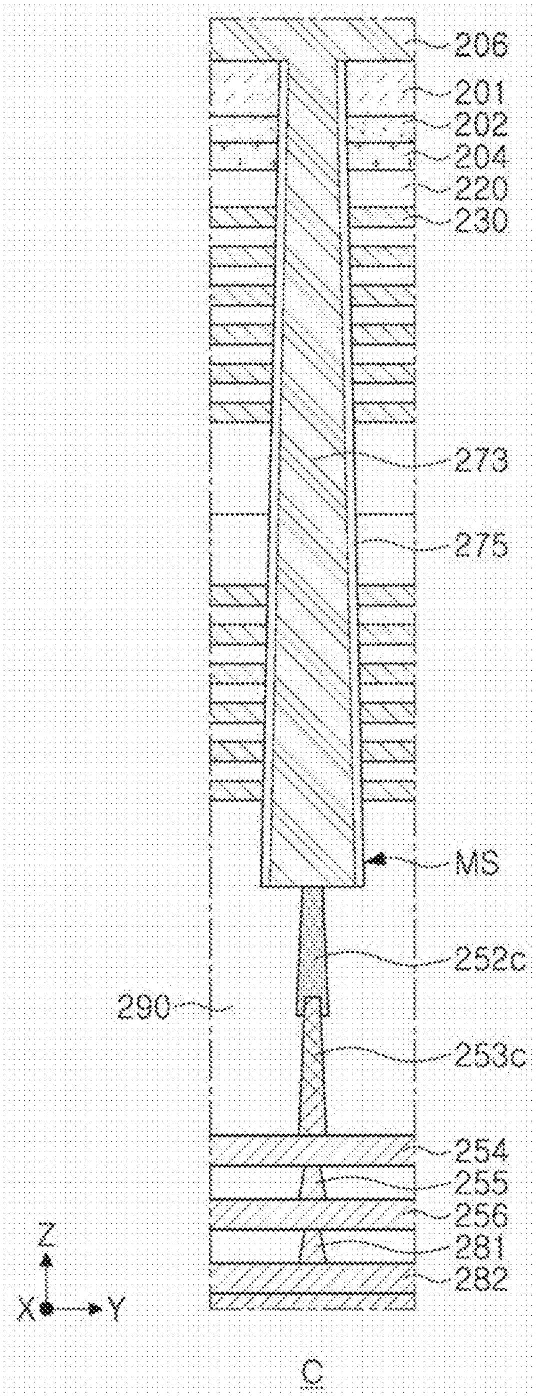
FIG. 3 is an enlarged diagram illustrating a portion of a semiconductor device according to an example embodiment.

FIG. 3 is an enlarged diagram illustrating a portion of a semiconductor device according to an example embodiment, illustrating a region corresponding to region "C" in FIG. 2.

Figure 4:
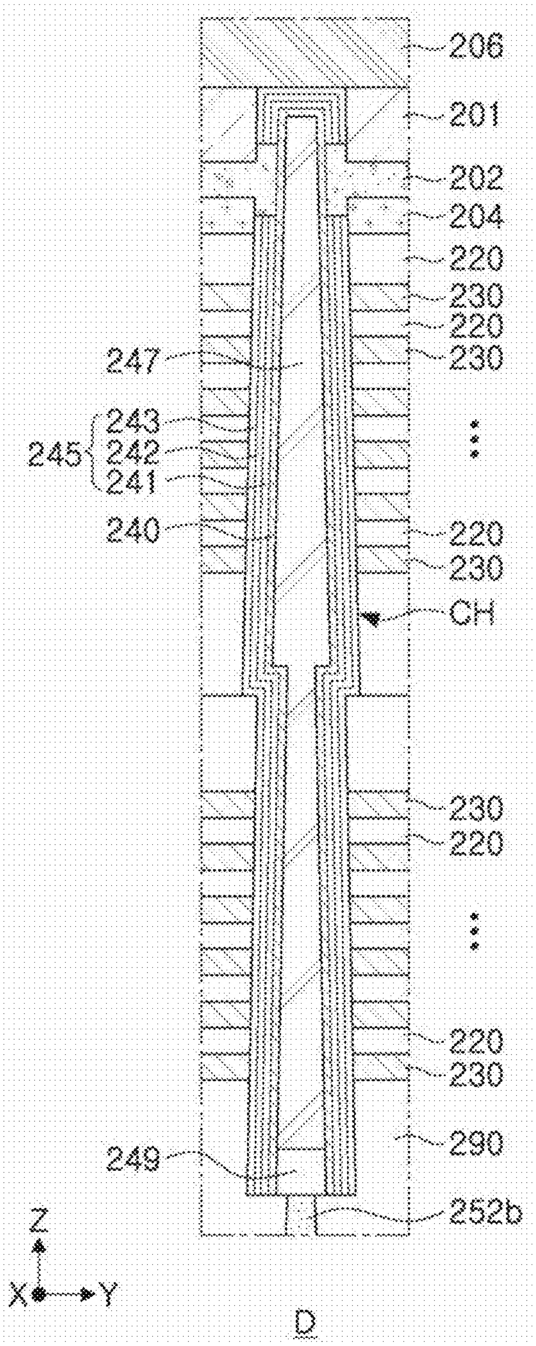
FIG. 4 is an enlarged diagram illustrating a portion of a semiconductor device according to an example embodiment.

FIG. 4 is an enlarged diagram illustrating a portion of a semiconductor device according to an example embodiment, illustrating a region corresponding to region "D" in FIG. 2.

Referring to FIGS. 2 to 4, the semiconductor device 100 may include the peripheral circuit region PERI which may be a first semiconductor structure including a first substrate 101, and the memory cell region CELL which may be a second semiconductor structure including a second substrate 201. The memory cell region CELL may be disposed on the peripheral circuit region PERI. The peripheral circuit region PERI and the memory cell region CELL may be bonded to each other through bonding structures 180 and 280. The bonding structures 180 and 280 may include a lower bonding structure 180 and an upper bonding structure 280. For example, the peripheral circuit region PERI and the memory cell region CELL may be bonded to each other by copper (Cu)-to-copper (Cu) bonding.

The peripheral circuit region PERI may include the first substrate 101, source/drain regions 105 in the first substrate 101, circuit devices 120 disposed on the first substrate 101, a lower wiring structure 130, the lower bonding structure 180, and a lower insulating layer 190.

The first substrate 101 may have an upper surface extending in the x direction and the y direction. An active region may be defined in the first substrate 101 by device isolation layers. The source/drain regions 105 including impurities may be disposed in a portion of the active region. The first substrate 101 may include a semiconductor material, such as a group IV semiconductor, a group III-V compound semiconductor, or a group II-VI compound semiconductor. The first substrate 101 may be provided as a bulk wafer or an epitaxial layer.

The circuit devices 120 may include a planar transistor. Each of the circuit devices 120 may include a circuit gate dielectric layer 122, a spacer layer 124, and a circuit gate electrode 125. The source/drain regions 105 may be disposed in the first substrate 101 on both sides of the circuit gate electrode 125.

The lower wiring structure 130 may be electrically connected to the circuit devices 120 and the source/drain regions 105. The lower wiring structure 130 may include lower contact plugs 131 and 133 having a cylindrical shape and lower wiring lines 132 and 134 having a line shape. The lower contact plugs 131 and 133 may include a first lower contact plug 131 and a second lower contact plug 133, and the lower wiring lines 132 and 134 may include a first lower wiring line 132 and a second lower wiring line 134. The first lower contact plug 131 may be disposed on the circuit devices 120 and the source/drain regions 105, and the second lower contact plug 133 may be disposed on the first lower wiring line 132. The first lower wiring line 132 may be disposed on the first lower contact plug 131, and the second lower wiring line 134 may be disposed on the second lower contact plug 133. The lower wiring structure 130 may include a conductive material, such as, for example, tungsten (W), copper (Cu), or aluminum (Al), and each of the components may further include a diffusion barrier. However, in example embodiments, the number of layers of the lower contact plugs 131 and 133 and the lower wiring lines 132 included in the lower wiring structure 130 and 134 and the arrangement form of the lower contact plugs 131 and 133 and the lower wiring lines 132 and 134 included in the lower wiring structure 130 may be varied.

The lower bonding structure 180 may be connected to the lower wiring structure 130. The lower bonding structure 180 may be connected to the upper bonding structure 280. The lower bonding structure 180 may include a lower bonding via 181 and a lower bonding pad 182 which may be a bonding layer. The lower bonding via 181 may be disposed on the second lower wiring line 134. The lower bonding pad 182 may be disposed on the lower bonding via 181. The lower bonding structure 180 may include a conductive material, such as, for example, tungsten (W), copper (Cu), or aluminum (Al), and each of the components may further include a diffusion barrier layer. The lower bonding structure 180 may provide an electrical connection path between the peripheral circuit region PERI and the memory cell region CELL together with the upper bonding structure 280.

The lower insulating layer 190 may be disposed on the circuit devices 120 on the first substrate 101. The lower insulating layer 190 may include a plurality of insulating layers. The lower insulating layer 190 may be formed of an insulating material.

The memory cell region CELL may include the second substrate 201, first and second horizontal conductive layers 202 and 204 disposed below the second substrate 201, a plate conductive layer 206 on the second substrate 201, gate electrodes 230 stacked below the second substrate 201, an isolation structure MS that extends and penetrates through the stack structure of the gate electrodes 230 and that includes a vertical conductive layer 273 and a liner insulating layer 275, a channel structure CH penetrating the stack structure, an upper wiring structure 250 electrically connected to the gate electrodes 230, the channel structures CH, and the isolation structure MS, and the upper bonding structure 280 connected to the upper wiring structure 250. The memory cell region CELL may further include a first sacrificial layer 211, a second sacrificial layer 212, and a third horizontal sacrificial layer 213, interlayer insulating layers 220 alternately stacked with the gate electrodes 230 below the second substrate 201, and an upper insulating layer 290 covering the gate electrodes 230. The memory cell region CELL may further include a conductive pad 270 spaced apart from the second substrate 201 and forming the input/output pad.

In the memory cell array region MCA, the gate electrodes 230 may be vertically stacked and the channel structures CH may be disposed. In the staircase region SA, the gate electrodes 230 may extend to have different lengths (i.e., in the y direction in FIG. 2) such that the staircase region SA may provide contact pads for electrically connecting the memory cells to the peripheral circuit region PERI.

The second substrate 201 may include a semiconductor material, such as, for example, a group IV semiconductor, a group III-V compound semiconductor, or a group II-VI compound semiconductor. For example, the group IV semiconductor may include silicon, germanium, or silicon-germanium. In some embodiments, the second substrate 201 may further include impurities. The second substrate 201 may be provided as a polycrystalline semiconductor layer such as a polycrystalline silicon layer or an epitaxial layer.

An upper end of the second substrate 201 may be disposed on substantially the same level as a level of an upper end of the channel structures CH. The second substrate 201 may be connected to the vertical conductive layer 273 through the plate conductive layer 206.

The first and second horizontal conductive layers 202 and 204 may be stacked on the lower surface of the second substrate 201 in the memory cell array region MCA. The first horizontal conductive layer 202 may function as a portion of a common source line of the semiconductor device 100, and for example, the first horizontal conductive layer 202 may function as a common source line together with the second substrate 201 and the plate conductive layer 206. The first horizontal conductive layer 202 may be directly connected to the channel layer 240 around the channel layer 240. The first horizontal conductive layer 202 may penetrate the gate dielectric layer 245 and may be in contact with the channel layer 240. In some embodiments, the first horizontal conductive layer 202 may not extend to the staircase region SA. In some embodiments, the second horizontal conductive layer 204 may also be disposed in the staircase region SA. The second horizontal conductive layer 204 may have substantially flat upper and lower surfaces in the memory cell array region MCA and the staircase region SA.

The first and second horizontal conductive layers 202 and 204 may include a semiconductor material, such as, for example, polycrystalline silicon. In this case, at least the first horizontal conductive layer 202 may be doped with impurities of the same conductivity type as that of the second substrate 201, and the second horizontal conductive layer 204 may be a doped layer or may include impurities diffused from the first horizontal conductive layer 202. However, the material of the second horizontal conductive layer 204 is not limited to the semiconductor material, and may be replaced with an insulating layer.

The first to third horizontal sacrificial layers 211, 212, and 213 may be disposed below the second substrate 201 in parallel with the first horizontal conductive layer 202 in a portion of the staircase region SA. The first to third horizontal sacrificial layers 211, 212, and 213 may be stacked in sequence below the second substrate 201. The first to third horizontal sacrificial layers 211, 212, and 213 may be layers remaining after a portion of the first to third horizontal sacrificial layers 211, 212, and 213 are replaced with the first horizontal conductive layer 202 in the process of manufacturing the semiconductor device 100. However, in example embodiments, the arrangement of regions of the staircase region SA in which the first to third horizontal sacrificial layers 211, 212, and 213 remain may be varied.

The first and third horizontal sacrificial layers 211 and 213, and the second horizontal sacrificial layer 212 may include different insulating materials. That is, in some embodiments, the second horizontal sacrificial layer 212 may have a different insulating material from an insulating material of the first horizontal sacrificial layer 212 and from an insulating material of the third horizontal sacrificial layer 213. The first and third horizontal sacrificial layers 211 and 213 may include the same material. For example, the first and third horizontal sacrificial layers 211 and 213 may be formed of the same material as a metal material of the interlayer insulating layers 220, and the second horizontal sacrificial layer 212 may be formed of the same material as a metal material of sacrificial insulating layers 218 (described below).

The gate electrodes 230 may be vertically stacked and spaced apart from each other below the second substrate 201 and may form a stack structure. The gate electrodes 230 may be disposed between the second substrate 201 and the upper wiring structure 250. The gate electrodes 230 may include electrodes forming a ground selection transistor, memory cells, and a string selection transistor from the second substrate 201 in sequence. The number of gate electrodes 230 included in the memory cells may be determined depending on capacity of the semiconductor device 100. In example embodiments, the number of gate electrodes 230 included in the string selection transistor and the ground selection transistor may be one or two or more, and the gate electrodes 230 included in the string selection transistor and the ground selection transistor may have a structure the same as or different from the gate electrodes 230 of the memory cells. In some embodiments, the gate electrodes 230 may further include a gate electrode 230 disposed below the gate electrodes 230 included in the string selection transistor and on the gate electrode 230 included in a ground select transistor and included in an erase transistor used for an erase operation using a gate induced drain leakage (GIDL) phenomenon. In some embodiments, a portion of the gate electrodes 230, for example, the gate electrodes 230 adjacent to the gate electrodes 230 included in the string select transistor and the ground select transistor may be dummy gate electrodes.

The gate electrodes 230 may be vertically stacked and spaced apart from each other in the memory cell array region MCA, may extend from the memory cell array region MCA to the staircase region SA by different lengths and may form a step difference. As illustrated in FIG. 2, the gate electrodes 230 may have a stepped structure in the x direction and may be disposed to have a stepped structure in the y direction as well. Due to the stepped structure, the gate electrodes 230 may form a staircase form in which the lower gate electrodes 230 may extend longer than the upper gate electrodes 230 and may provide ends exposed downwardly from the interlayer insulating layers 220. In example embodiments, the gate electrodes 230 may have an increased thickness on the ends. Although not illustrated, a portion of the upper gate electrodes 230 may be isolated by an upper isolation structure extending in the x direction.

The gate electrodes 230 may form a lower gate stacking group and an upper gate stacking group on the lower gate stacking group. The interlayer insulating layers 220 disposed between the lower gate stacking group and the upper gate stacking group may have a relatively thick thickness, but example embodiments thereof are not limited thereto. In FIG. 2, two stacking groups of the gate electrodes 230 may be disposed vertically, but example embodiments thereof are not limited thereto, and the gate electrodes 230 may form a single stacking group or a plurality of stacking groups.

The gate electrodes 230 may include a metal material, such as, for example, tungsten (W), copper (Cu), or aluminum (Al).

According to an example embodiment, the gate electrodes 230 may include polycrystalline silicon or a metal silicide material. In example embodiments, the gate electrodes 230 may further include a diffusion barrier layer, and for example, the diffusion barrier layer may include tungsten nitride (WN), tantalum nitride (TaN), or titanium nitride (TiN), or a combination thereof.

The interlayer insulating layers 220 may be disposed between the gate electrodes 230. Similarly to the gate electrodes 230, the interlayer insulating layers 220 may be spaced apart from each other in a direction perpendicular to the lower surface of the second substrate 201 (i.e., the z direction in FIG. 2) and may extend in the x direction. The interlayer insulating layers 220 may include an insulating material such as silicon oxide or silicon nitride.

The plate conductive layer 206 may be disposed on the upper surface of the second substrate 201 in the memory cell array region MCA and the staircase region SA. The plate conductive layer 206 may include a conductive material, such as, for example, a metal material such as tungsten (W), copper (Cu), or aluminum (Al), or a semiconductor material such as polycrystalline silicon, and the plate conductive layer 206 may further include a diffusion barrier layer.

The plate conductive layer 206 may be connected to the second substrate 201 and the vertical conductive layer 273. The plate conductive layer 206 may be in contact with the second substrate 201 and the vertical conductive layer 273 through the lower surface of the plate conductive layer 206. The plate conductive layer 206 may be electrically connected to the channel layer 240 through the second substrate 201. Only the vertical conductive layer 273 may be provided as a structure directly connected to the plate conductive layer 206 to apply an electrical signal. The plate conductive layer 206 may receive an electrical signal through the vertical conductive layer 273 and may function as a portion of a common source line of the semiconductor device 100, and may function as, for example, a common source line together with the second substrate 201 and the conductive layer 202.

The isolation structure MS may be disposed to extend in the x direction by penetrating through the gate electrodes 230 in the memory cell array region MCA and the staircase region SA. The isolation structure MS may penetrate the entirety of the gate electrodes 230 stacked below the second substrate 201 and may be connected to the second substrate 201. The isolation structure MS may extend in the x direction and may isolate the gate electrodes 230 from each other in the y direction. The isolation structure MS may include the vertical conductive layer 273 and the liner insulating layer 275. The liner insulating layer 275 may surround an external side surface of the vertical conductive layer 273. The vertical conductive layer 273 may have a shape in which a width of the upper region thereof may be smaller than a width of the lower region thereof due to a high aspect ratio, as illustrated in FIGS. 2-4. The vertical conductive layer 273 may be connected to the plate conductive layer 206. The vertical conductive layer 273 may be electrically connected to the channel layer 240 through the plate conductive layer 206 and the second substrate 201. The vertical conductive layer 273 may transmit an electrical signal applied through the source contacts 252*c* and 253*c* to the channel layer 240 via the plate conductive layer 206 and the second substrate 201. The vertical conductive layer 273 may extend from a lower portion of the plate conductive layer 206 to be integrated with the plate conductive layer 206. The vertical conductive layer 273 and the plate conductive layer 206 may be formed through a deposition process or continuous deposition processes and may be formed as an integrated layer. In some embodiments, an interfacial surface may not be present between the vertical conductive layer 273 and the plate conductive layer 206. The vertical conductive layer 273 may include the same conductive material as a conductive material of the plate conductive layer 206, such as, for example, a metal material such as tungsten (W), copper (Cu), or aluminum (Al), or a semiconductor material such as polycrystalline silicon. In some embodiments, the vertical conductive layer 273 may further include a diffusion barrier layer. The liner insulating layer 275 may include an insulating material such as silicon oxide or silicon nitride.

Each of the channel structures CH may form a memory cell string, and may be spaced apart from each other while forming rows and columns in the memory cell array region MCA. The channel structures CH may be disposed to form a grid pattern in the X-Y plane or may be disposed in a zigzag pattern in one direction. The channel structures CH may extend in the Z direction, may have a columnar shape, and may have inclined side surfaces of which a width may decrease toward the second substrate 201 depending on an aspect ratio.

Each of the channel structures CH may have a form in which lower and upper channel structures penetrating the lower gate stacking group and the upper gate stacking group, respectively, of the gate electrodes are connected to each other, and may have a bent portion formed due to a difference or changes in the width in the connection region.

As illustrated in FIG. 4, a channel layer 240 may be disposed in the channel structures CH. The channel layer 240 of the lower channel structures and the channel layer 240 of the upper channel structures may be connected to each other. In the channel structures CH, the channel layer 240 may be formed in an annular shape surrounding the filling insulating layer 247 therein. However, in some example embodiments, the channel layer 240 may have a columnal shape such as a cylindrical shape or a prism shape without the filling insulating layer 247. The channel layer 240 may be connected to the first horizontal conductive layer 202 in an upper portion. The channel layer 240 may include a semiconductor material such as polycrystalline silicon or single crystal silicon.

A channel pad 249 may be disposed below the channel layer 240 in the channel structures CH. The channel pad 249 may cover the lower surface of the filling insulating layer 247 and may be in contact with the channel layer 240. The channel pad 249 may include, for example, doped polycrystalline silicon.

The gate dielectric layer 245 may be disposed between the gate electrodes 230 and the channel layer 240. The gate dielectric layer 245 may include a tunneling layer 241, a charge storage layer 242, and a blocking layer 243 stacked in sequence from the channel layer 240 outward. The tunneling layer 241 may tunnel electric charges into the charge storage layer 242, and may include, for example, silicon oxide ($SiO_2$), silicon nitride ($Si_3N_4$), or silicon oxynitride (SiON), or a combination thereof. The charge storage layer 242 may be a charge trap layer or a floating gate conductive layer. The blocking layer 243 may include silicon oxide ($SiO_2$), silicon nitride ($Si_3N_4$), silicon oxynitride (SiON), or a high-k dielectric material, or a combination thereof. In example embodiments, at least a portion of the gate dielectric layer 245 may extend in a horizontal direction along the gate electrodes 230.

The upper wiring structure 250 may be electrically connected to the gate electrodes 230, the channel layer 240 of the channel structures CH, and the vertical conductive layer 273. The upper wiring structure 250 may include a contact plug 251' having a cylindrical shape, connection contacts 252' and 253', gate contacts **251*a*, 252*a*, and 253*a*, channel contacts 252*b* and 253*b*, source contacts 252*c* and 253*c*, and upper contact plug 255, and may include upper wiring lines 254 and 256 having a line shape. The gate contacts 251*a*, 252*a*, and 253*a* may include a first gate contact 251*a*, a second gate contact 252*a* on the first gate contact 251*a*, and a third gate contact 253*a* on the second gate contact 252*a*. The channel contacts 252*b* and 253*b* may include a first channel contact 252*b* and a second channel contact 253*b*. The source contacts 252*c* and 253*c* may include a first source contact 252*c* and a second source contact 253*c*. The upper wiring lines 254 and 256 may include a first upper wiring line 254 and a second upper wiring line 256. The contact plug 251' may be electrically connected to the upper wiring lines 254 and 256 through connection contacts 252' and 253'** disposed therebelow.

The contact plug 251' may be directly connected to the conductive pad 270 in the external side region OA. The contact plug 251' may have, for example, a column shape, and may have a width decreasing toward the upper portion depending on an aspect ratio. For example, in some embodiments, the width of the upper end of the contact plug 251' may be smaller than the width of the lower end. For example, the width of the contact plug 251' may decrease toward the conductive pad 270 or in a direction of being away from the first substrate 101.

The gate contacts **251*a*, 252*a*, and 253*a* may be connected to the gate electrodes 230 in the staircase region SA. The gate contacts 251*a*, 252*a*, and 253*a* may be disposed to be connected to each of the gate electrodes 230 penetrating at least a portion of the upper insulating layer 290 and exposed upwardly. The channel contacts 252*b* and 253*b* may be electrically connected to the channel layer 240 through the channel pad 249** of the channel structures CH in the memory cell array region MCA.

The source contacts **252*c* and 253*c* may be connected to the vertical conductive layer 273. The source contacts 252*c* and 253*c* may be electrically connected to the plate conductive layer 206 through the vertical conductive layer 273**.

The first upper wiring line 254 may be disposed below the third gate contact **253*a*, the second channel contact 253*b*, and the second source contact 253*c*, and the second upper wiring line 256 may be disposed below the upper contact plug 255. The upper contact plug 255 may be disposed below the first upper wiring line 254. The upper wiring structure 250 may include a conductive material, such as, for example, tungsten (W), copper (Cu), or aluminum (Al), and each of the components may further include a diffusion barrier layer. However, in example embodiments, the number of layers of the contacts 251*a*, 252*a*, 252*b*, 252*c*, 253*a*, 253*b*, 253*c*, and 255 and the upper wiring lines 254 and 256 included in the upper wiring structure 250** and the arrangement form thereof may be varied.

The conductive pad 270 may be an input/output pad of the semiconductor device 100 and may be electrically connected to a controller. The conductive pad 270 may be in direct contact with the upper surface of the contact plug 251'. The conductive pad 270 may be electrically connected to the circuit devices 120 in the peripheral circuit region PERI.

The upper bonding structure 280 may be connected to the upper wiring structure 250. The upper bonding structure 280 may be connected to the lower bonding structure 180. The upper bonding structure 280 may include an upper bonding via 281 and an upper bonding pad 282 which may be a bonding layer. The upper bonding via 281 may be disposed below the second upper wiring line 256. The upper bonding pad 282 may be disposed below the upper bonding via 281.

The upper bonding structure 280 may include a conductive material, such as, for example, tungsten (W), copper (Cu), or aluminum (Al), and each of the components may further include a diffusion barrier layer.

The upper insulating layer 290 may be disposed to cover the second substrate 201, the gate electrodes 230 disposed below the second substrate 201, and the lower insulating layer 190. The upper insulating layer 290 may include a plurality of insulating layers. The upper insulating layer 290 may be formed of an insulating material.

Figure 5:
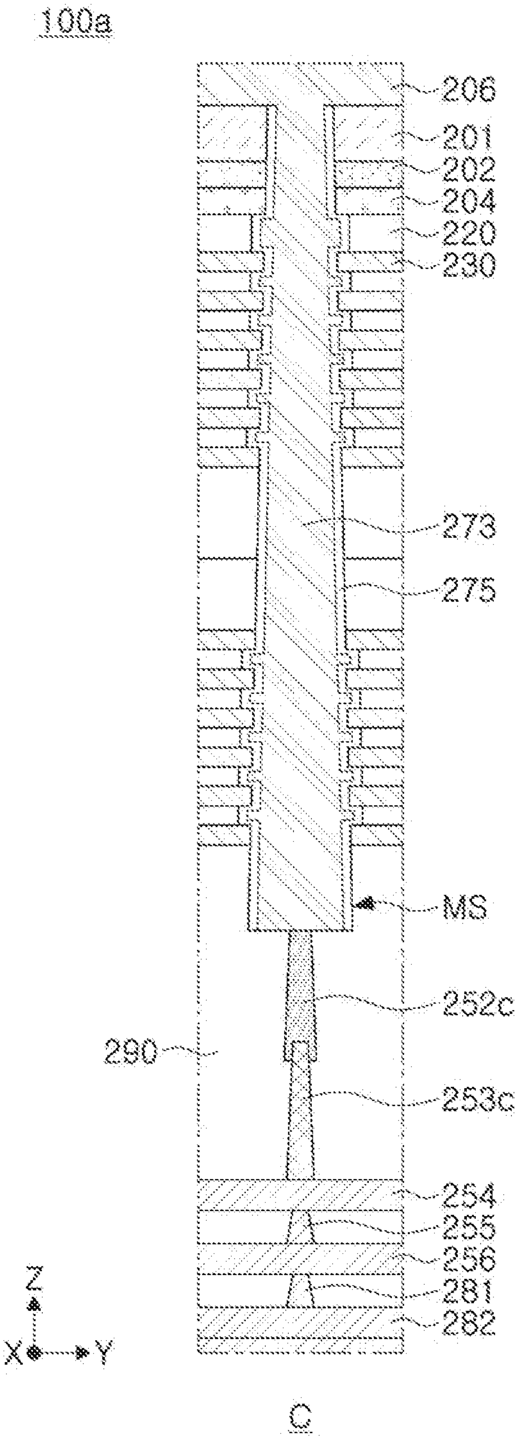
FIG. 5 is an enlarged diagram illustrating a portion of a semiconductor device according to an example embodiment.

FIG. 5 is an enlarged diagram illustrating a portion of a semiconductor device according to an example embodiment, illustrating a region corresponding to region "C" in FIG. 2.

Referring to FIG. 5, in the isolation structure MS of the semiconductor device 100*a*, the liner insulating layer 275 may have a protruding shape in a region in contact with the interlayer insulating layers 220. The interlayer insulating layers 220 may be laterally recessed into the isolation structure MS, and vertical conductive layer 273 and the liner insulating layer 275 may be expanded to the region to which the interlayer insulating layers 220 are recessed. Accordingly, the vertical conductive layer 273 and the liner insulating layer 275 may include protrusions on external side surfaces thereof. In example embodiments, when the liner insulating layer 275 is relatively thick, the protrusions may not be formed on the external side surface of the vertical conductive layer 273.

Figure 6:
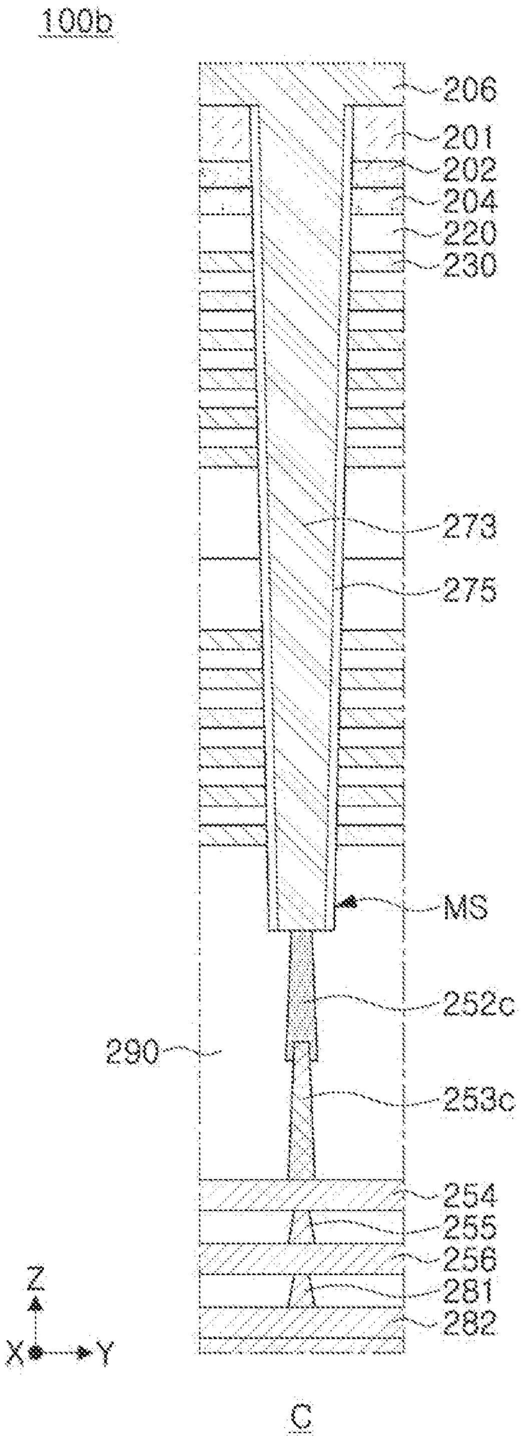
FIG. 6 is an enlarged diagram illustrating a portion of a semiconductor device according to an example embodiment.

FIG. 6 is an enlarged diagram illustrating a portion of a semiconductor device according to an example embodiment, illustrating a region corresponding to region "C" in FIG. 2.

Referring to FIG. 6, differently from the example embodiment in FIG. 3, the vertical conductive layer 273 may have a shape in which a width of the upper region thereof may be greater than a width of the lower region thereof in the isolation structure MS of a semiconductor device 100*b*. Such a structure may be formed by etching the insulating layer 277 present in the isolation structure MS during the manufacturing process described below with reference to FIG. 21.

Figure 7:
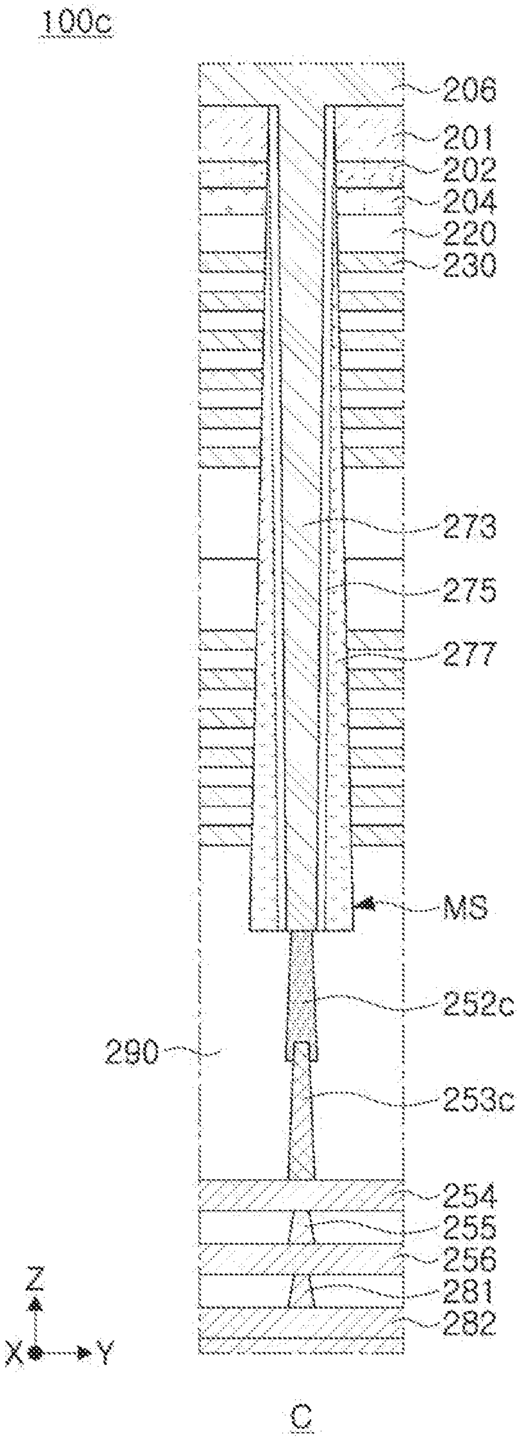
FIG. 7 is an enlarged diagram illustrating a portion of a semiconductor device according to an example embodiment.

FIG. 7 is an enlarged diagram illustrating a portion of a semiconductor device according to an example embodiment, illustrating a region corresponding to region "C" in FIG. 2.

Referring to FIG. 7, the isolation structure MS of the semiconductor device 100*c* may further include an insulating layer 277 in addition to the vertical conductive layer 273 and the liner insulating layer 275. The insulating layer 277 may surround an external side surface of the liner insulating layer 275. The isolation structure MS may have a shape in which the width of the lower region thereof may be greater than the width of the upper region thereof. Differently from the example embodiment of the isolation structure MS in FIG. 3, the vertical conductive layer 273 may have a shape in which the width of the upper region thereof may be greater than the width of the lower region. In example embodiments, the insulating layer 277 may be disposed to surround a portion of the liner insulating layer 275. In example embodiments, a level of the upper end of the insulating layer 277 may be varied, and in some example embodiments, the insulating layer 277 may be disposed to surround a portion of the liner insulating layer 275 of than the upper portion of the liner insulating layer 275. In example embodiments, the relative thicknesses of the vertical conductive layer 273 and the insulating layer 277 may be varied.

Figure 8:
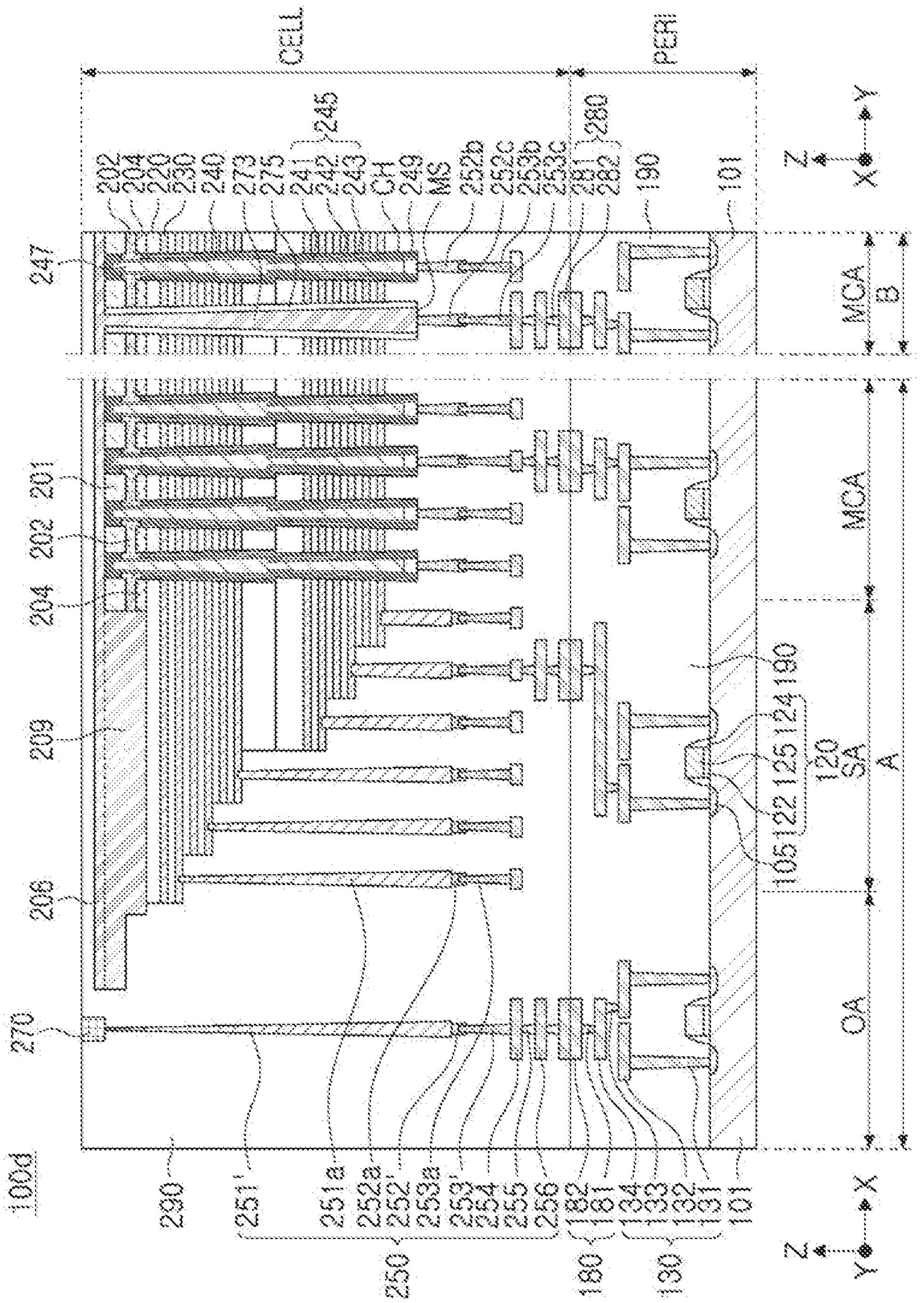
FIG. 8 is a cross-sectional diagram illustrating a semiconductor device according to an example embodiment.

FIG. 8 is a cross-sectional diagram illustrating a semiconductor device according to an example embodiment.

Referring to FIG. 8, the semiconductor device 100*d* may include a plate extension layer 209. A plate extension layer 209 may be disposed below the plate conductive layer 206. In some embodiments, the plate extension layer 209 may be present only in the staircase region SA. The second substrate 201 and the first to third horizontal sacrificial layers 211, 212, and 213 may omitted from the staircase region SA. The plate extension layer 209 may include the same conductive material as a conductive material of the plate conductive layer 206, such as, for example, a metal material such as tungsten (W), copper (Cu) or aluminum (Al), or a semiconductor material such as polycrystalline silicon. In some embodiments, the plate extension layer 209 may further include a diffusion barrier layer. The plate extension layer 209 may be connected to the plate conductive layer 206. The plate extension layer 209 may be integrated with the plate conductive layer 206 and may form an integrated layer. The plate extension layer 209 may be connected to the second substrate 201 and the plate conductive layer 206. The plate extension layer 209 may be connected to the second substrate 201 through a side surface of the plate extension layer 209 and may be connected to the plate conductive layer 206 through an upper surface of the plate extension layer 209. The plate extension layer 209 may be electrically connected to the channel layer 240 through the second substrate 201. The plate extension layer 209 may receive an electrical signal through the vertical conductive layer 273 and the plate conductive layer 206 and may function as a portion of the common source line of the semiconductor device 100*d*. For example, the plate extension layer 209 may function as a common source line together with the second substrate 201, the first horizontal conductive layer 202, and the plate conductive layer 206.

Figure 9:
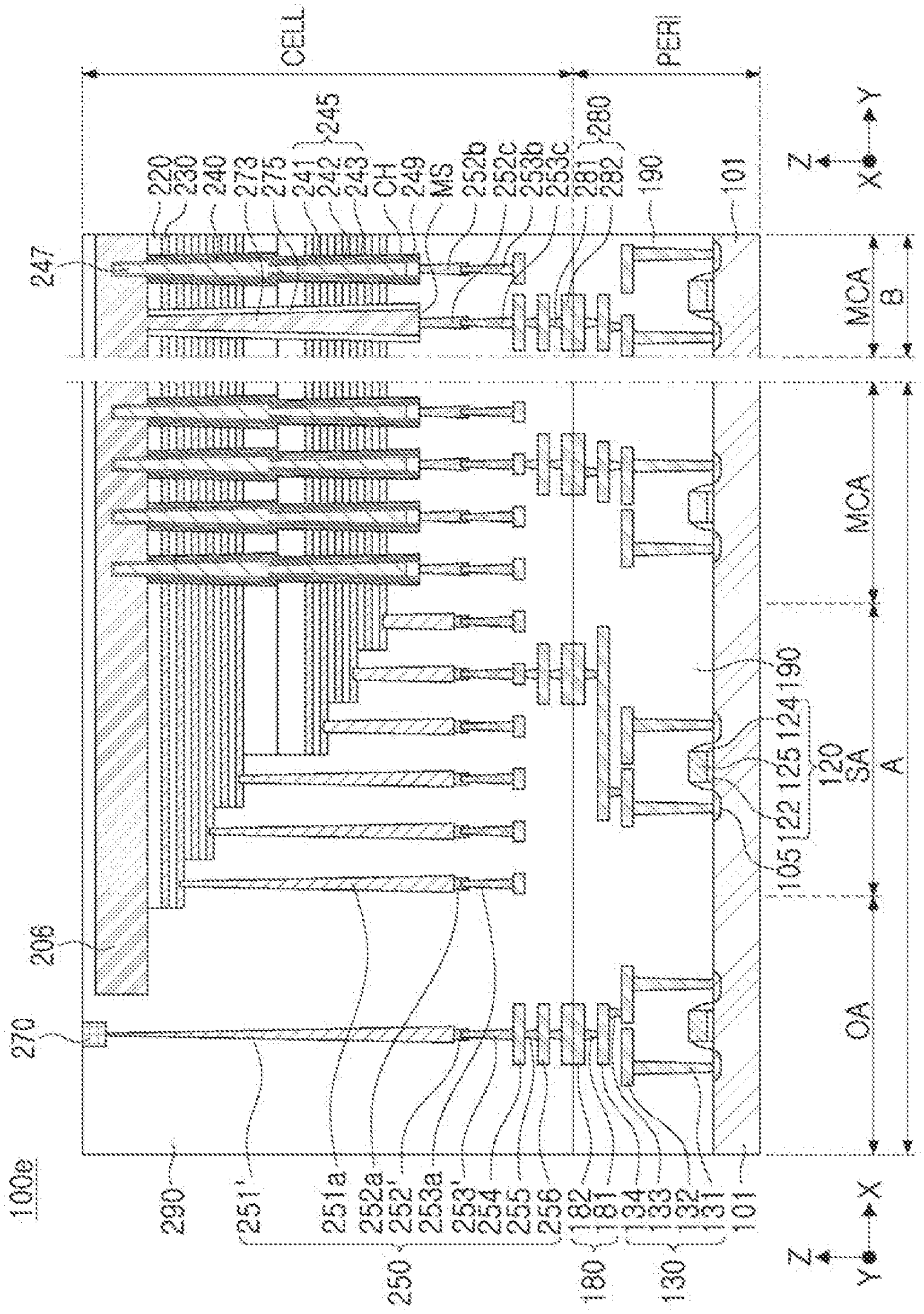
FIG. 9 is a cross-sectional diagram illustrating a semiconductor device according to an example embodiment.

FIG. 9 is a cross-sectional diagram illustrating a semiconductor device according to an example embodiment.

Figure 10:
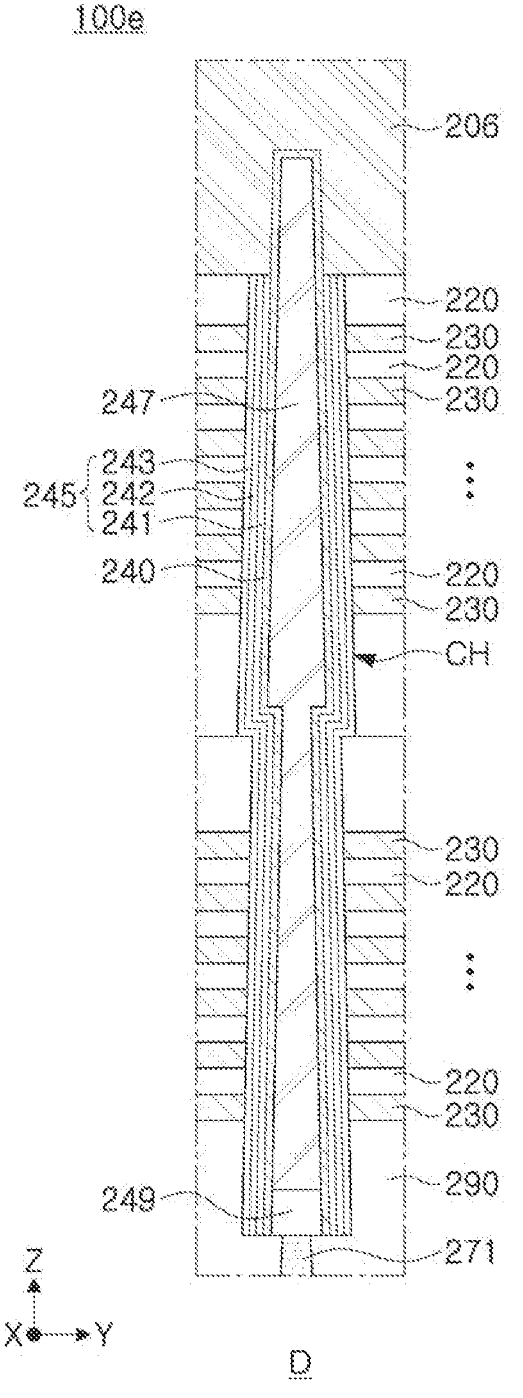
FIG. 10 is an enlarged diagram illustrating a portion of a semiconductor device according to an example embodiment.

FIG. 10 is an enlarged diagram illustrating a portion of a semiconductor device according to an example embodiment, illustrating a region corresponding to region "D" in FIG. 2.

Referring to FIGS. 9 and 10, differently from the example embodiment in FIG. 2, a semiconductor device 100*e* may omit the second substrate 201, the first and second horizontal conductive layers 202 and 204, and the first to third horizontal sacrificial layers 211, 212, and 213. The plate conductive layer 206 of the semiconductor device 100*e* may cover the upper surface of the channel layer 240 and may surround an upper portion of the external side surface of the channel layer 240. That is, in some embodiments, the channel layer 240 may extend into the plate conductive layer 206 such that a level of an uppermost surface of the channel layer 240 may be higher than a level of the lower surface of the plate conductive layer 206. The plate conductive layer 206 may be connected to the channel layer 240. A lower surface of the plate conductive layer 206 may be in contact with an upper surface of the interlayer insulating layers 220 disposed on an uppermost end. In a region from which the gate dielectric layer 245 on the upper end of each of the channel structures CH is removed, the channel layer 240 and the plate conductive layer 206 may be in direct contact with each other.

Figure 11:
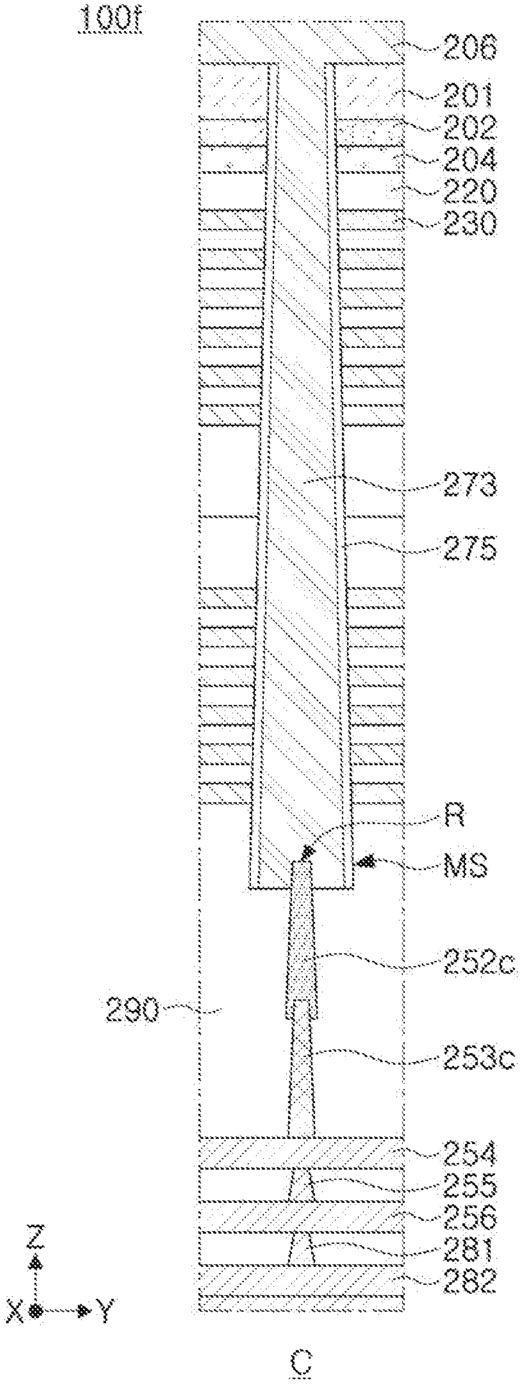
FIG. 11 is an enlarged diagram illustrating a portion of a semiconductor device according to an example embodiment.

FIG. 11 is an enlarged diagram illustrating a portion of a semiconductor device according to an example embodiment, illustrating a region corresponding to region "C" in FIG. 2.

Referring to FIG. 11, differently from the example embodiment in FIG. 2, a lower portion of the vertical conductive layer 273 of the semiconductor device 100*f* may have a recess region R formed by the first source contact 252*c*. A portion of an upper portion of the source contact

252*c* may be disposed in the vertical conductive layer 273, and a lower portion of the vertical conductive layer 273 may surround the upper portion of the first source contact 252*c*. For example, a level of an uppermost surface of the source contact 252*c* may be higher than a level of a lowermost surface of the vertical conductive layer 273.

Figure 12:
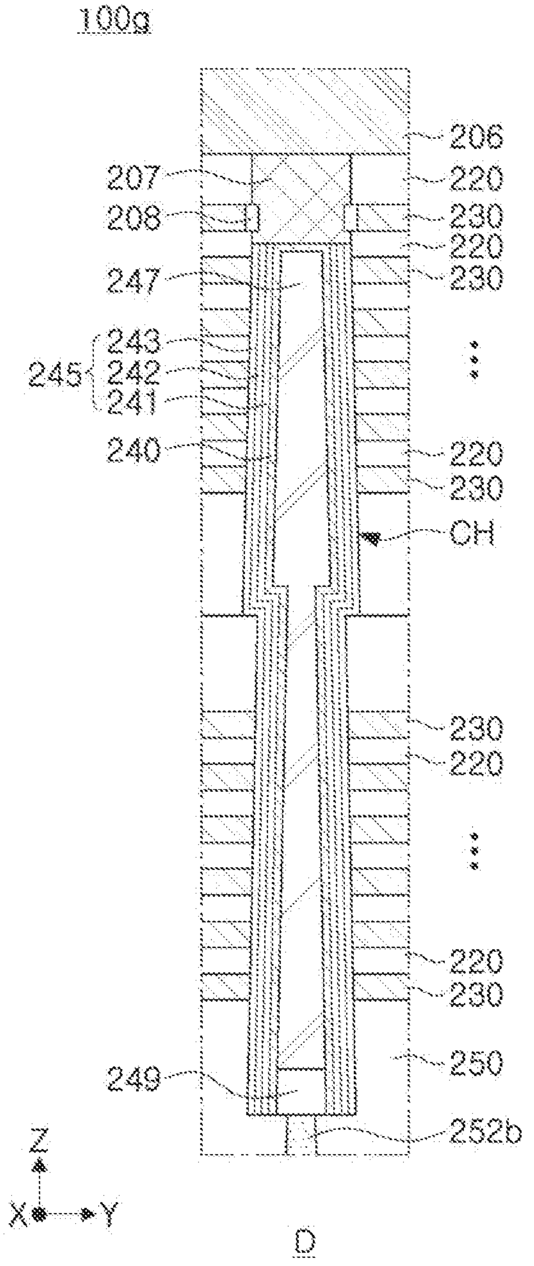
FIG. 12 is an enlarged diagram illustrating a portion of a semiconductor device according to an example embodiment.

FIG. 12 is an enlarged diagram illustrating a portion of a semiconductor device according to an example embodiment, illustrating a region corresponding to region "D" in FIG. 2.

Referring to FIG. 12, differently from the example embodiment in FIG. 2, in the semiconductor device 100*g*, the memory cell region CELL may omit the first and second horizontal conductive layers 202 and 204 and in some embodiments, the channel structures CH may further include an epitaxial layer 207.

The epitaxial layer 207 may be disposed to be in contact with the plate conductive layer 206 on an upper end of the channel structures CH, and may be disposed on a side surface of at least one gate electrode 230. The level of the lower surface of the epitaxial layer 207 may be lower than a level of the lower surface of the uppermost gate electrode 230 and higher than the upper surface of a gate electrode 230 immediately below the uppermost gate electrode 230, but example embodiments thereof are not limited thereto. The epitaxial layer 207 may be connected to the channel layer 240 through a lower surface of the epitaxial layer 207. A gate insulating layer 208 may be further disposed between the epitaxial layer 207 and the gate electrode 230 adjacent to the epitaxial layer 207.

Figure 13:
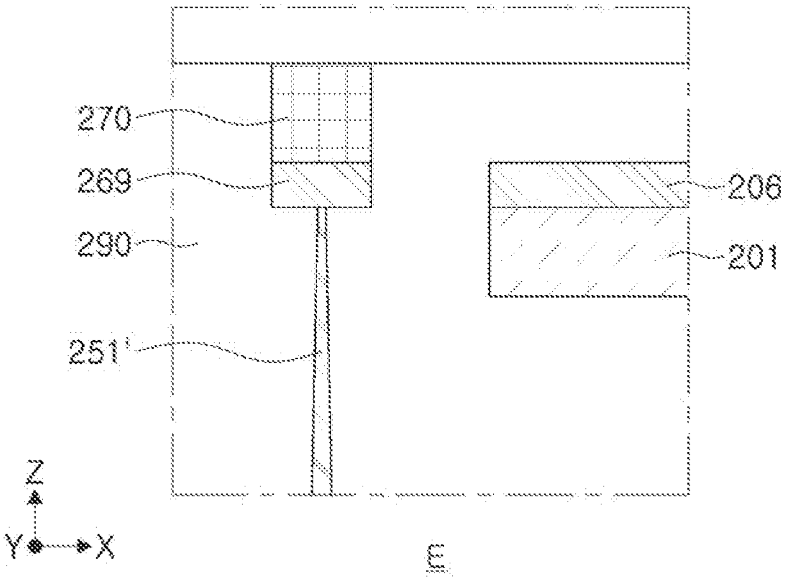
FIG. 13 is an enlarged diagram illustrating a portion of a semiconductor device according to an example embodiment.

FIG. 13 is an enlarged diagram illustrating a portion of a semiconductor device according to an example embodiment, illustrating a region corresponding to region "E" in FIG. 2.

Referring to FIG. 13, a semiconductor device 100*h* may include a pad auxiliary layer 269. The pad auxiliary layer 269 may be spaced apart from the plate conductive layer 206. The pad auxiliary layer 269 may be connected to the conductive pad 270 and the contact plug 251'. The pad auxiliary layer 269 may be formed together with the plate conductive layer 206 and may have the same thickness as that of the plate conductive layer 206. The pad auxiliary layer 269 may include the same conductive material as a conductive material of the plate conductive layer 206, such as, for example, a metal material such as tungsten (W), copper (Cu), or aluminum (Al), or a semiconductor material such as polycrystalline silicon. In some embodiments, the pad auxiliary layer 269 may further include a diffusion barrier layer.

FIGS. 14 to 23 are cross-sectional diagrams illustrating a method of manufacturing a semiconductor device according to example embodiments, illustrating regions corresponding to regions in FIG. 2.

Figure 14:
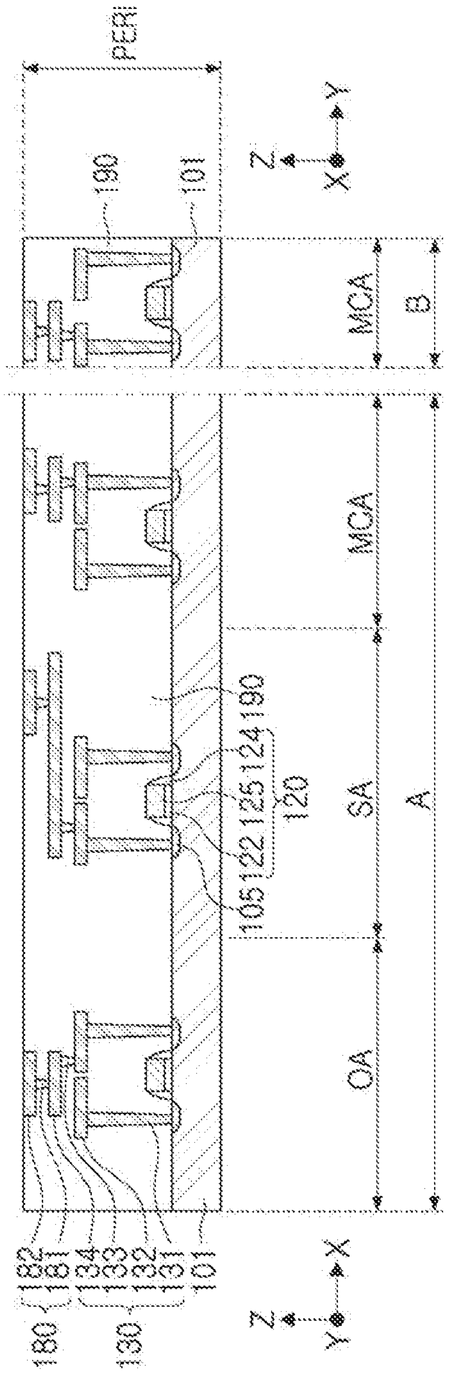
FIGS. 14 to 23 are cross-sectional diagrams illustrating a method of manufacturing a semiconductor device according to some example embodiments.

Referring to FIG. 14, the circuit devices 120, the lower wiring structure 130, and the lower bonding structure 180 included in the peripheral circuit region PERI may be formed on the first substrate 101.

First, device isolation layers may be formed in the first substrate 101, and a circuit gate dielectric layer 122 and a circuit gate electrode 125 may be formed in sequence on the first substrate 101. The device isolation layers may be formed by, for example, a shallow trench isolation (STI) process. The circuit gate dielectric layer 122 and the circuit gate electrode 125 may be formed using atomic layer deposition (ALD) or chemical vapor deposition (CVD). The circuit gate dielectric layer 122 may be formed of silicon oxide, and the circuit gate electrode 125 may be formed of at least one of polycrystalline silicon or a metal silicide layer, but an example embodiment thereof is not limited thereto. Thereafter, a spacer layer 124 and source/drain regions 105 may be formed on both sidewalls of the circuit gate dielectric layer 122 and the circuit gate electrode 125. In example embodiments, the spacer layer 224 may include a plurality of layers.

The lower contact plugs 131 and 133 of the lower wiring structure 130 may be formed by forming a portion of the lower insulating layer 190, removing a portion by etching, and filling a conductive material therein. The lower wiring lines 132 and 134 may be formed by, for example, depositing a conductive material and patterning the material.

The lower bonding via 181 of the lower bonding structure 180 may be formed by forming a portion of the lower insulating layer 190, removing a portion by etching, and filling a conductive material therein. The lower bonding pad 182 may be formed by, for example, depositing a conductive material and patterning the material. The lower bonding structure 180 may be formed by, for example, a deposition process or a plating process. When the bonding layer is formed by a plating process, a seed layer may be formed preferentially.

The lower insulating layer 190 may include a plurality of insulating layers. A portion of the lower insulating layer 190 may be formed in each of the processes of forming the lower wiring structure 130 and the lower bonding structure 180. Accordingly, the peripheral circuit region PERI may be formed.

Figure 15:
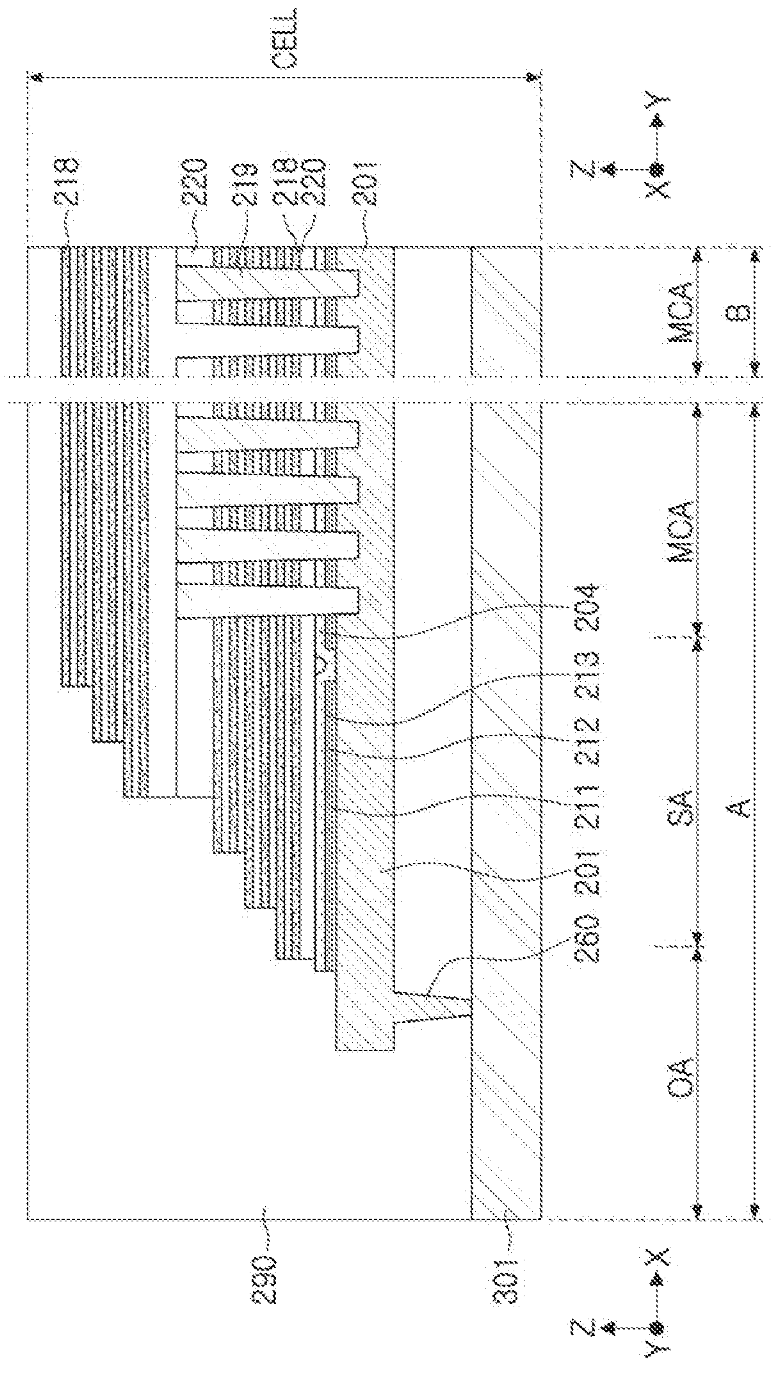

Referring to FIG. 15, a ground via 260 may be formed on a base substrate 301, and thereafter, the second substrate 201, the first to third horizontal sacrificial layers 211, 212, and 213, and the second horizontal conductive layer 204 may be formed, and sacrificial insulating layers 218 and interlayer insulating layers 220 may be alternately stacked.

First, a portion of the upper insulating layer 290 may be formed on the base substrate 301, and a ground via 260 penetrating therethrough may be formed. The base substrate 301 may include a semiconductor material, such as, for example, a group IV semiconductor, a group III-V compound semiconductor, or a group II-VI compound semiconductor. The base substrate 301 may be provided to control the thickness of the second substrate 201 in a subsequent process of removing the base substrate 301. For example, a portion of the upper insulating layer 290 may be disposed between the base substrate 301 and the second substrate 201. The ground via 260 may be formed by forming via holes penetrating a portion of the upper insulating layer 290 and filling the via holes with a semiconductor material.

Thereafter, a second substrate 201 may be formed, and first to third horizontal sacrificial layers 211, 212, and 213 and a second horizontal conductive layer 204 may be formed on the second substrate 201. The second substrate 201 may be spaced apart from the base substrate 301 by a portion of the upper insulating layer 290. The first to third horizontal sacrificial layers 211, 212, and 213 may be stacked in sequence on the second substrate 201. The first to third horizontal sacrificial layers 211, 212, and 213 in the memory cell array region MCA may be replaced with a first horizontal conductive layer 202 (in FIG. 2) formed through a subsequent process. The second horizontal conductive layer 204 may be formed on the third horizontal sacrificial layer 213.

First and second mold structures may be formed by alternately stacking the sacrificial insulating layers 218 and the interlayer insulating layers 220. Specifically, a second horizontal conductive layer 204 may be formed, a first mold structure may be formed, a vertical sacrificial layer 219 penetrating the first mold structure may be formed, and the second mold structure may be formed.

The sacrificial insulating layers 218 may be partially replaced with gate electrodes 230 (in FIG. 2) through a subsequent process. The sacrificial insulating layers 218 may be formed of a material different from that of the interlayer insulating layers 220, and may be formed of a material etched with etch selectivity with respect to the interlayer insulating layers 220 under specific etching conditions. For example, the interlayer insulating layers 220 may be formed of at least one of silicon oxide and silicon nitride, and the sacrificial insulating layers 218 may be formed of a material different from that of the interlayer insulating layers, selected from among silicon, silicon oxide, silicon carbide, and silicon nitride. In example embodiments, the thicknesses of the interlayer insulating layers 220 may not be the same. The thickness of the interlayer insulating layers 220 and the sacrificial insulating layers 218 and the number of films included in the interlayer insulating layers 220 and the sacrificial insulating layers 218 may be varied from the illustrated examples.

A photolithography process and an etching process for the sacrificial insulating layers 218 may be repeatedly performed using a mask layer such that the upper sacrificial insulating layers 218 may extend shorter than the lower sacrificial insulating layers 218 in the staircase region SA. Accordingly, the sacrificial insulating layers 218 may form a stepped structure in a predetermined unit.

Thereafter, an upper insulating layer 290 covering the stack structure of the sacrificial insulating layers 218 and the interlayer insulating layers 220 may be formed.

Figure 16:
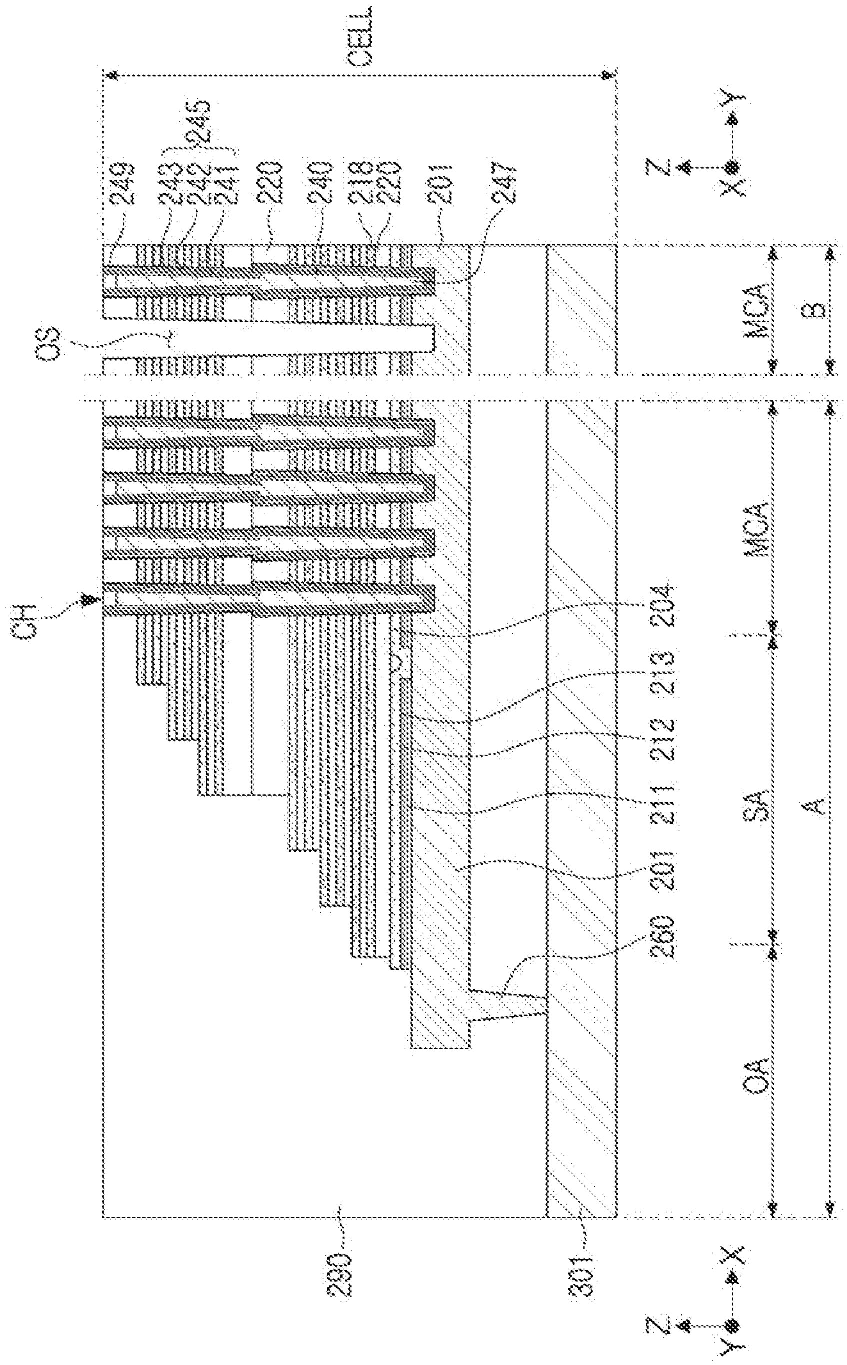

Referring to FIG. 16, channel structures CH penetrating through the stack structure of the sacrificial insulating layers 218 and the interlayer insulating layers 220 may be formed. Openings OS penetrating through the stack structure of the sacrificial insulating layers 218 and the interlayer insulating layers 220 may be formed in regions corresponding to the isolation structure MS (in FIG. 2).

The channel structures CH may be formed by anisotropically etching the sacrificial insulating layers 218 and the interlayer insulating layers 220 using a mask layer, and may be formed by forming channel holes having a hole shape and filling the holes. The vertical sacrificial layer 219 (in FIG. 15) may be removed through the upper channel hole penetrating through the second mold structure, and the gate dielectric layer 245, the channel layer 240, and the channel filling insulating layer 247 and the channel pad 249 may be formed in the lower channel hole and the upper channel hole. When a plasma dry etching process is used to form the channel holes, a potential difference may be generated in upper and lower portions of the channel holes by ions generated in the channel holes. However, since the second horizontal conductive layer 204 and the second substrate 201 are connected to the base substrate 301 by the ground via 260, positive charges may flow to the base substrate 301, for example, and negative charges moved through the mask layer may flow from the edge of the wafer to the base substrate 301, thereby preventing an arcing defect due to the potential difference.

Due to the height of the stack structure, sidewalls of the channel structures CH may not be perpendicular to the upper surface of the second substrate 201. The channel structures CH may be formed to recess a portion of the second substrate 201.

The gate dielectric layer 245 may be formed to have a uniform thickness using an ALD or CVD process. In this process, an entirety or a portion of the gate dielectric layer 245 may be formed, and a portion extending perpendicularly to the second substrate 201 along the channel structures CH may be formed in this process. The channel layer 240 may be formed on the gate dielectric layer 245 in the channel structures CH. The channel filling insulating layer 247 may fill the channel structures CH, and may be an insulating material. The channel pad 249 may be formed of a conductive material, such as, for example, polycrystalline silicon.

Thereafter, the openings OS may penetrate through the stack structure of the sacrificial insulating layers 218 and the interlayer insulating layers 220, and may penetrate through the second horizontal conductive layer 204 and the first to third horizontal sacrificial layers 211, 212, and 213.

Figure 17:
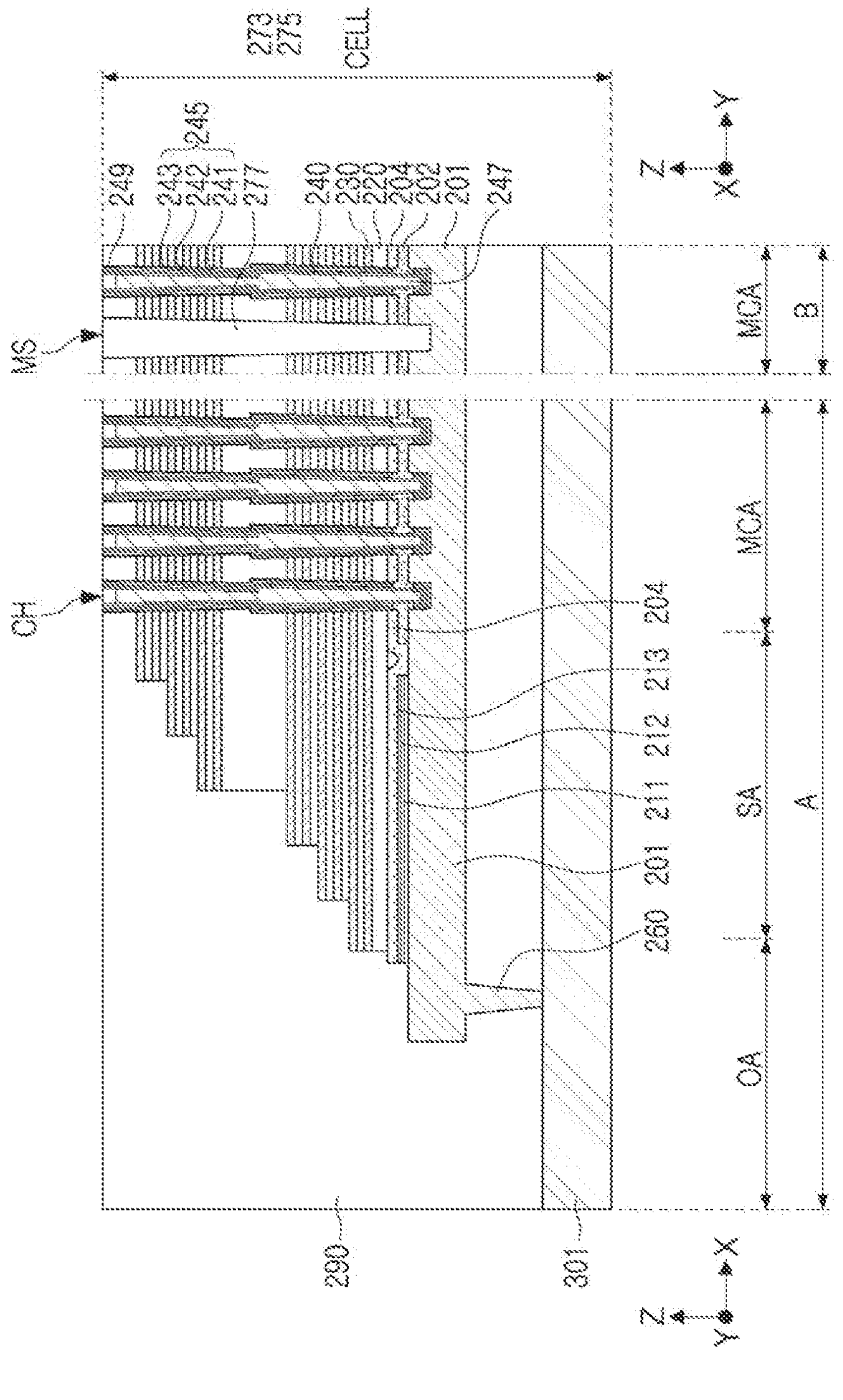

Referring to FIG. 17, the sacrificial insulating layers 218 may be removed through the openings OS and gate electrodes 230 may be formed.

First, the second horizontal sacrificial layer 212 may be exposed by an etch-back process while forming sacrificial spacer layers in the openings. The second horizontal sacrificial layer 212 may be selectively removed from the exposed region in the memory cell array region MCA, and the upper and lower first and third horizontal sacrificial layers 211 and 213 may be removed.

The first to third horizontal sacrificial layers 211, 212, and 213 may be removed by, for example, a wet etching process. In the process of removing the first and third horizontal sacrificial layers 211 and 213, a portion of the gate dielectric layer 245 exposed in the region from which the second horizontal sacrificial layer 212 is removed may also be removed. The first horizontal conductive layer 202 may be formed by depositing a conductive material in the region from which the first to third horizontal sacrificial layers 211, 212, and 213 are removed, and the sacrificial spacer layers may be removed from the openings. Through this process, the first horizontal conductive layer 202 may be formed in the memory cell array region MCA, and first to third horizontal sacrificial layers 211, 212, and 213 may be formed in the staircase region SA.

Thereafter, tunnel portions may be formed by removing the sacrificial insulating layers 218 through the openings OS, and gate electrodes 230 may be formed by filling the tunnel portions with a conductive material. The conductive material may include a metal, polycrystalline silicon, or a metal silicide material. The gate electrodes 230 may be formed, the conductive material deposited in the openings may be removed through an additional process, and the insulating layer 277 may be formed by filling the insulating material.

Figure 18:
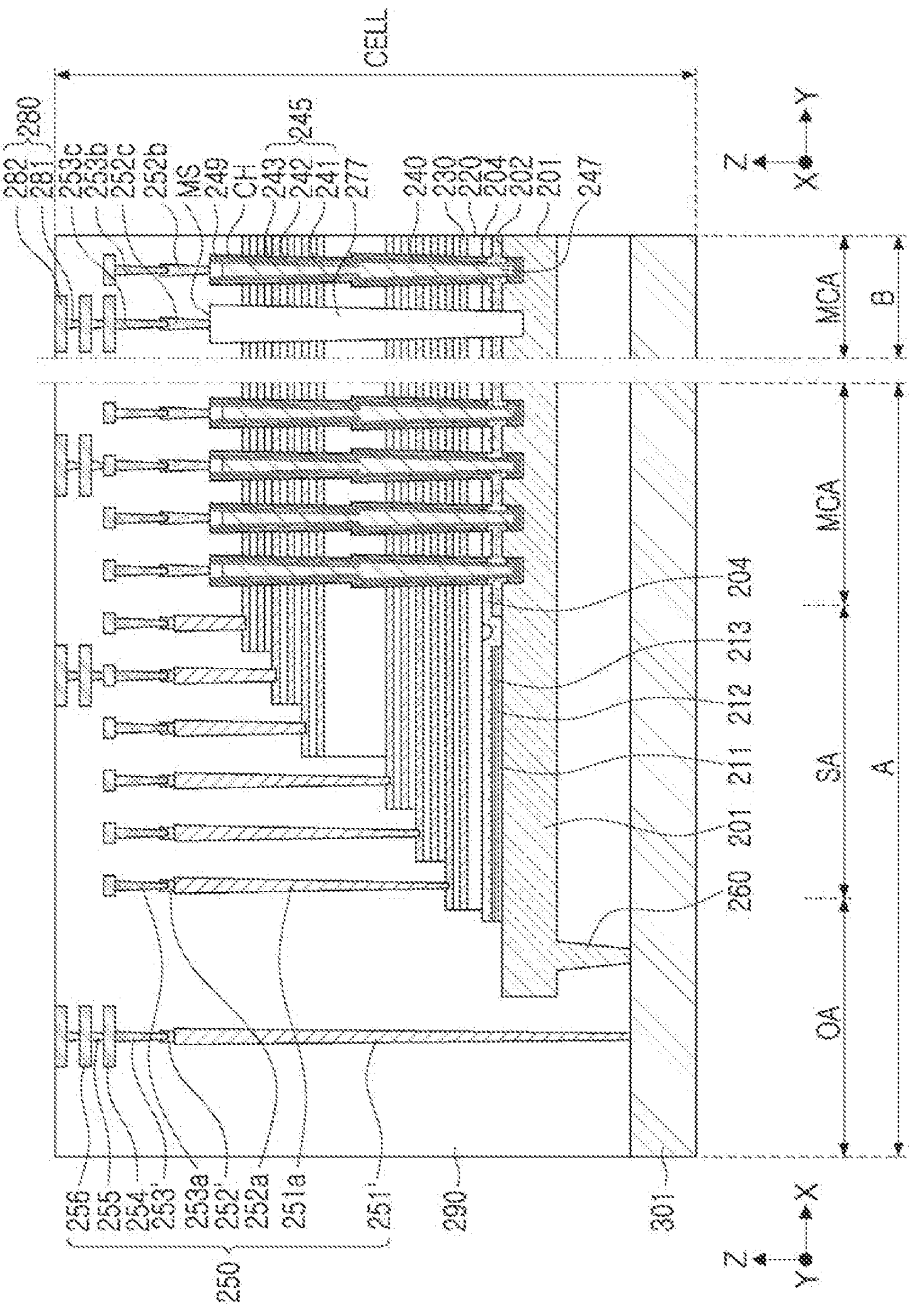

Referring to FIG. 18, gate contacts 251*a*, 252*a*, and 253*a*, channel contacts 252*b* and 253*b*, source contacts 252*c* and 253*c*, upper contact plug 255, upper wiring lines 254 and 256, and a contact plug 251' may be formed, and an upper bonding structure 280 may be formed.

The first gate contact 251*a* of the gate contacts 251*a*, 252*a*, and 253*a* may be formed to be connected to the gate electrodes 230 in the staircase region SA, the first channel contact 252*b* of the first gate contact 251*a* of the gate contacts 252*b* and 253*b* may be formed to be connected to the channel pad 249, and the first source contact 252*c* of the source contacts 252*c* and 253*c* may be connected to the vertical conductive layer 273.

The gate contacts 251*a*, 252*a*, and 253*a*, the channel contacts 252*b* and 253*b*, the source contacts 252*c* and 253*c*, the upper contact plug 255, the upper wiring lines 254 and 256, and the contact plugs 251' may have different depths, and may be formed by simultaneously forming contact holes using an etch stop layer and filling the contact holes with a conductive material. However, in example embodiments, a portion of the gate contacts 251$a$, 252$a$, and 253$a$, the channel contacts 252$b$ and 253$b$, the source contacts 252$c$ and 253$c$, the upper contact plug 255, the upper wiring lines 254 and 256, and the contact plugs 251' may be formed in different processes.

Thereafter, the upper bonding structure 280 may be formed in a manner similar to that of forming the lower bonding structure 180. Accordingly, the memory cell region CELL may be formed. However, during the process of manufacturing the semiconductor device, the memory cell region CELL may include the base substrate 301.

Figure 19:
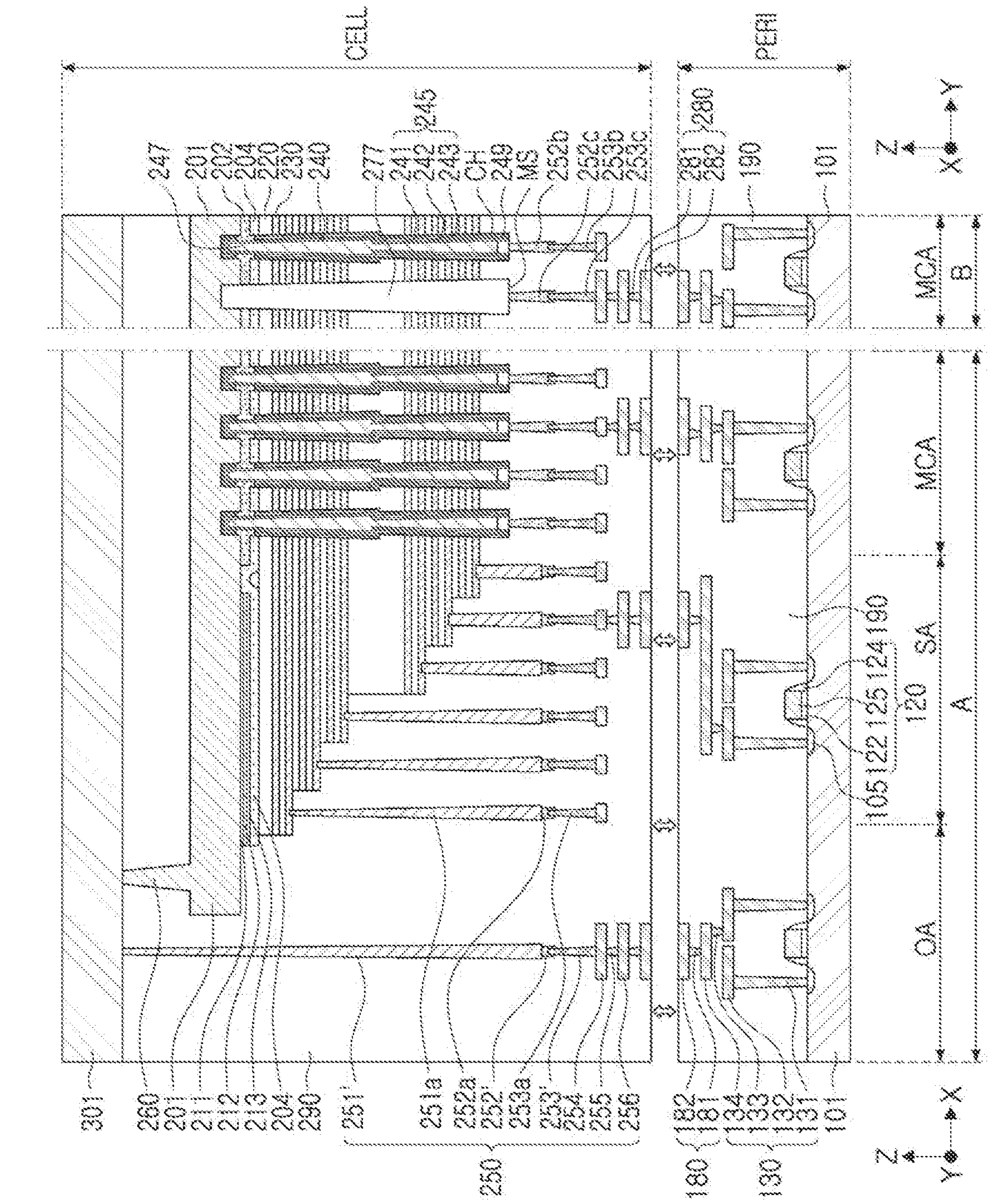

Referring to FIG. 19, the peripheral circuit region PERI which may be the first substrate structure and the memory cell region CELL which may be the second substrate structure may be bonded to each other.

The peripheral circuit region PERI and the memory cell region CELL may be connected by bonding the lower bonding pad 182 to the upper bonding pad 282 by pressing. The memory cell region CELL may be disposed upside down on the peripheral circuit region PERI and may be bonded such that upper bonding pad 282 may fact downwardly. The peripheral circuit region PERI and the memory cell region CELL may be directly bonded to each other without providing an adhesive such as a separate adhesive layer. For example, in some embodiments, the peripheral circuit region PERI and the memory cell region CELL may be bonded to each other by copper (Cu)-to-copper (Cu) bonding.

Figure 20:
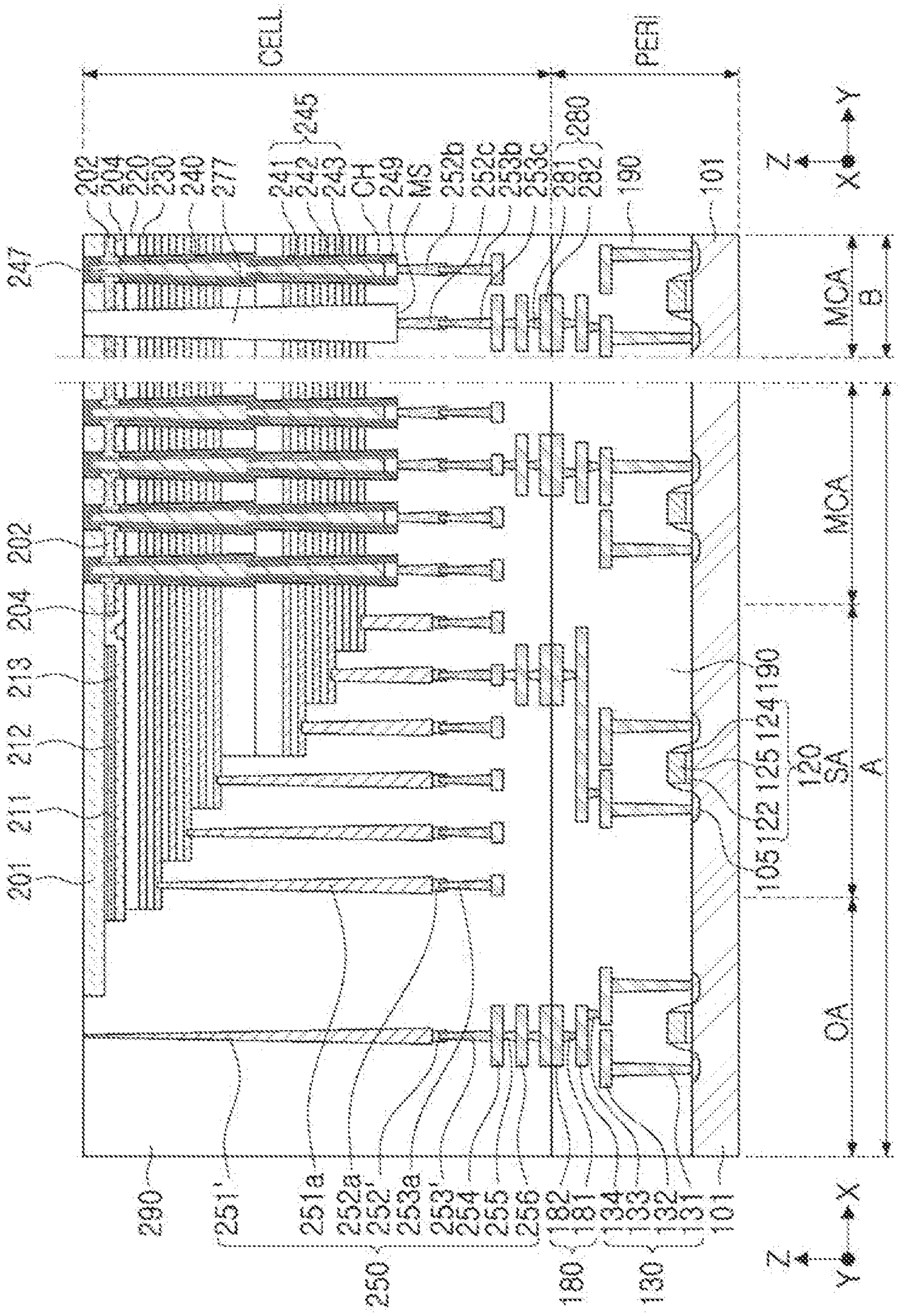

Referring to FIG. 20, the base substrate 301 and the ground via 260 may be removed, and the second substrate 201 and the contact plug 251' may be exposed.

The base substrate 301 and the ground via 260 may be removed by, for example, a polishing process such as a grinding process. Accordingly, upper surfaces of the second substrate 201 and the contact plug 251' may be exposed. In this case, the blocking layer 243 disposed on an upper end of the channel structures CH may be used as a polishing stop layer. The upper end of the second substrate may be disposed on substantially the same level as a level of the upper end of the channel structures CH.

Figure 21:
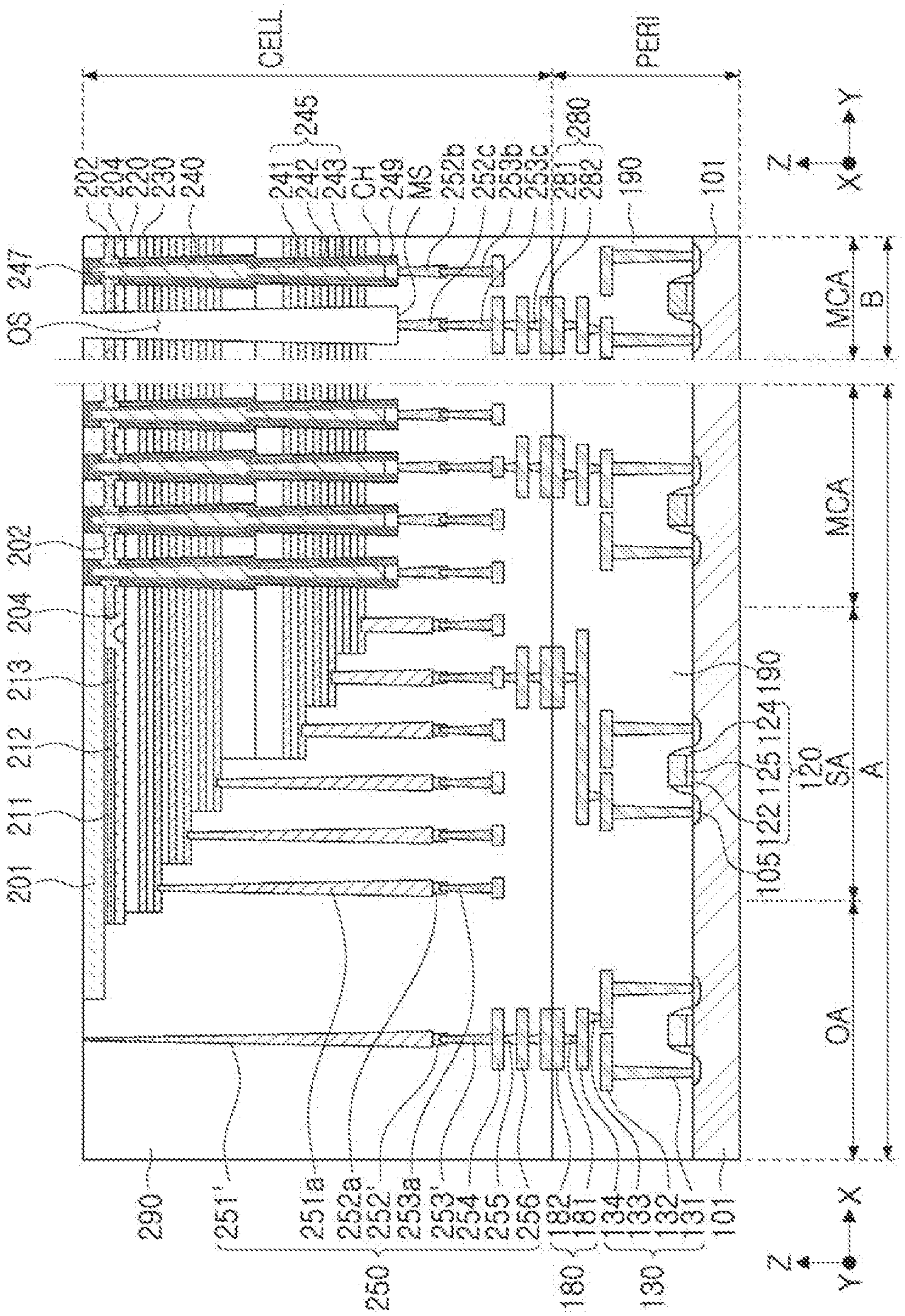

Referring to FIG. 21, the insulating layer 277 present in the isolation structure MS may be removed.

The insulating layer 277 may be removed by performing a photolithography process and an etching process. In this case, the first source contact 252$c$ may be used as an etch stop layer. As illustrated in FIG. 7, in some embodiments, a portion of the insulating layer 277 may not be removed, and the insulating layer 277 may surround an entirety or a portion of an external side surface of the liner insulating layer 275.

Figure 22:
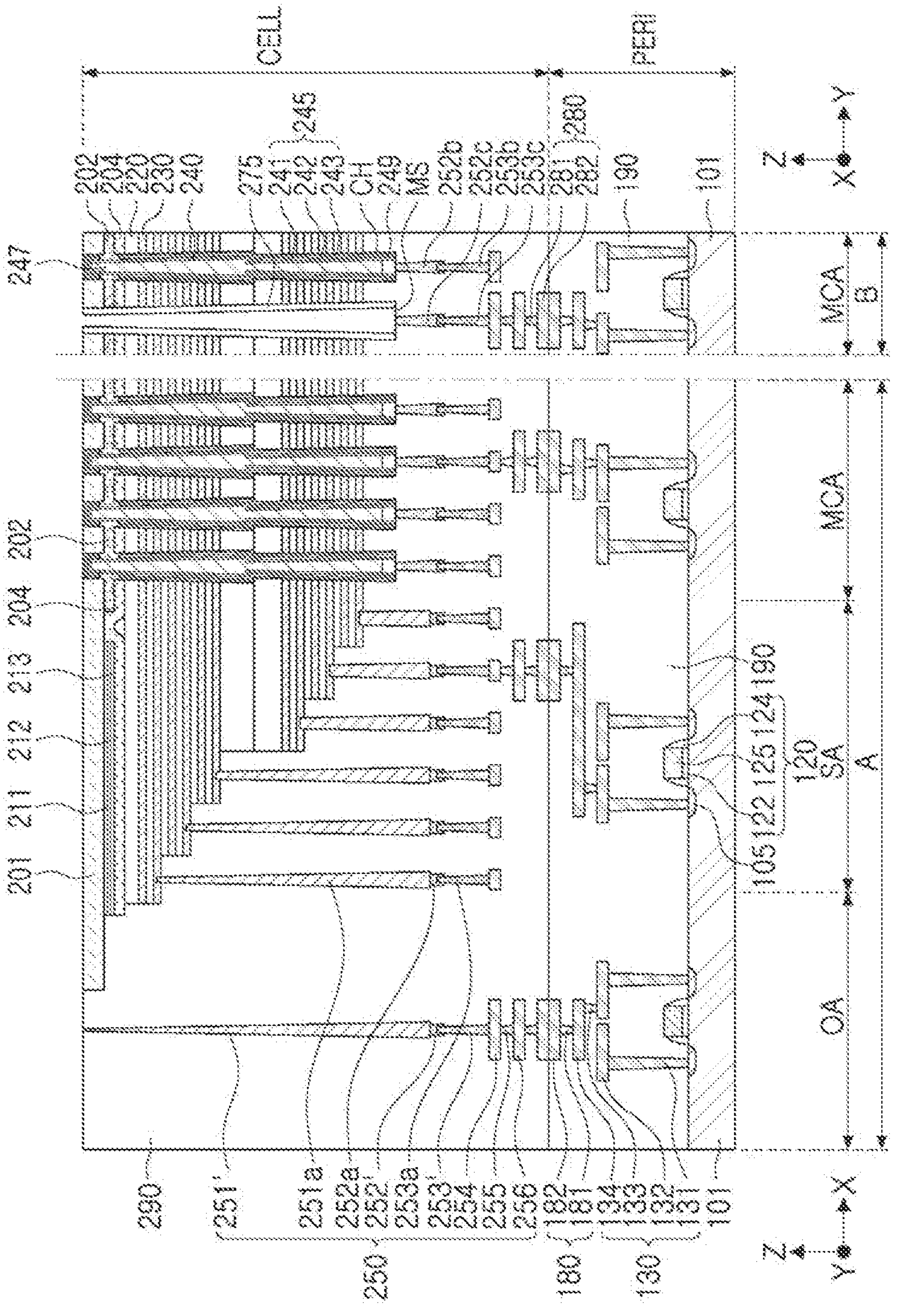

Referring to FIG. 22, a liner insulating layer 275 may be formed in the isolation structure MS.

The liner insulating layer 275 may be formed by depositing an insulating material in the isolation structure and removing a portion of the insulating material by performing a photolithography process and an etching process. In this case, the first source contact 252$c$ may be used as an etch stop layer.

Figure 23:
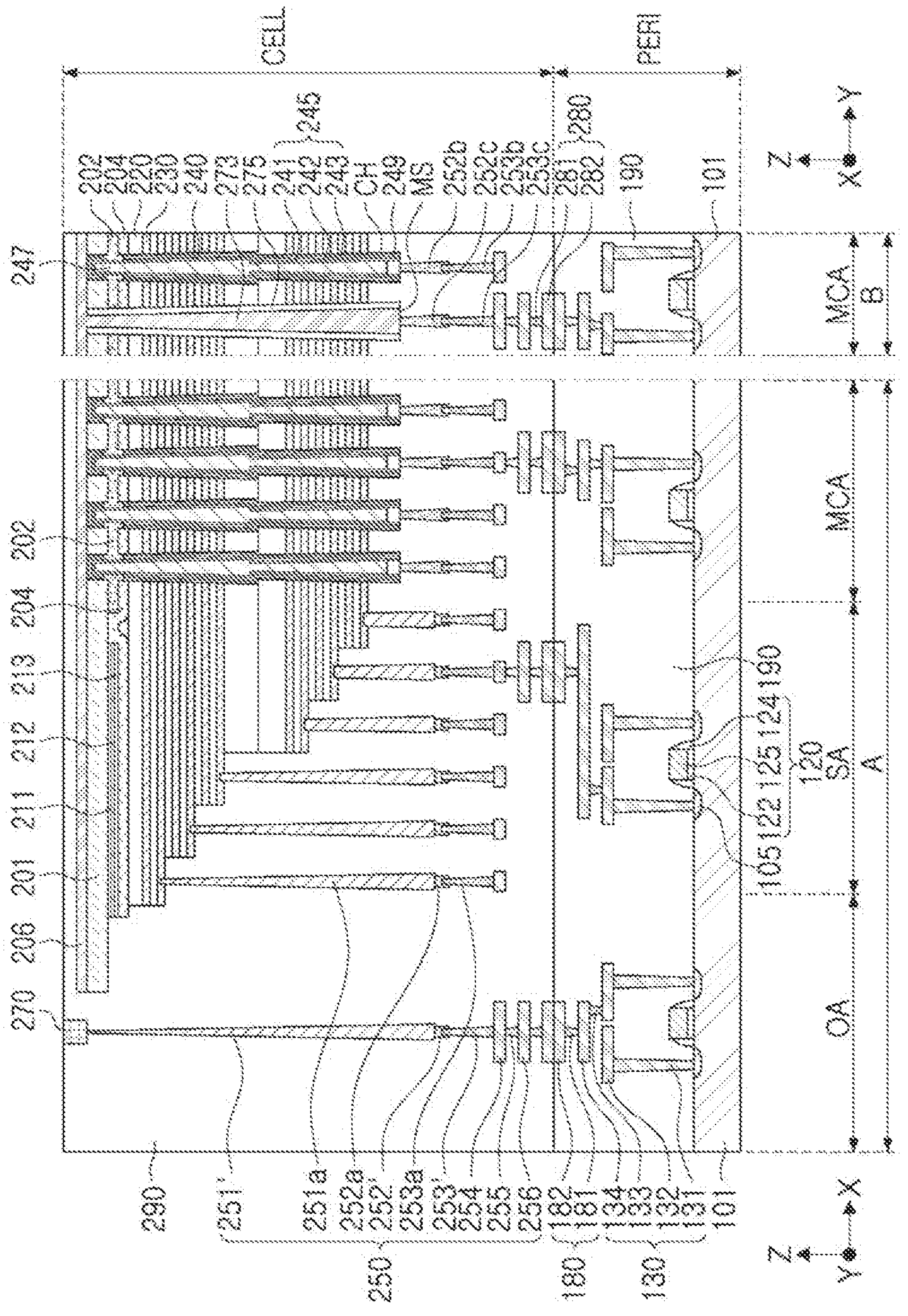

Referring to FIG. 23, a vertical conductive layer 273, a plate conductive layer 206, and a conductive pad 270 may be formed.

The vertical conductive layer 273 and the plate conductive layer 206 may be formed by a process of depositing a conductive material or consecutive processes of depositing a conductive material. In this case, the vertical conductive layer 273 may include the same conductive material as a conductive material of the plate conductive layer 206, and may extend from a lower portion of the plate conductive layer 206 to be integrated with the plate conductive layer 206.

Thereafter, the conductive pad 270 may be formed by forming the upper insulating layer 290, removing a portion of the upper insulating layer 290 and filling the portion with a conductive material. Accordingly, the semiconductor device in FIGS. 1 to 4 may be manufactured.

Figure 24:
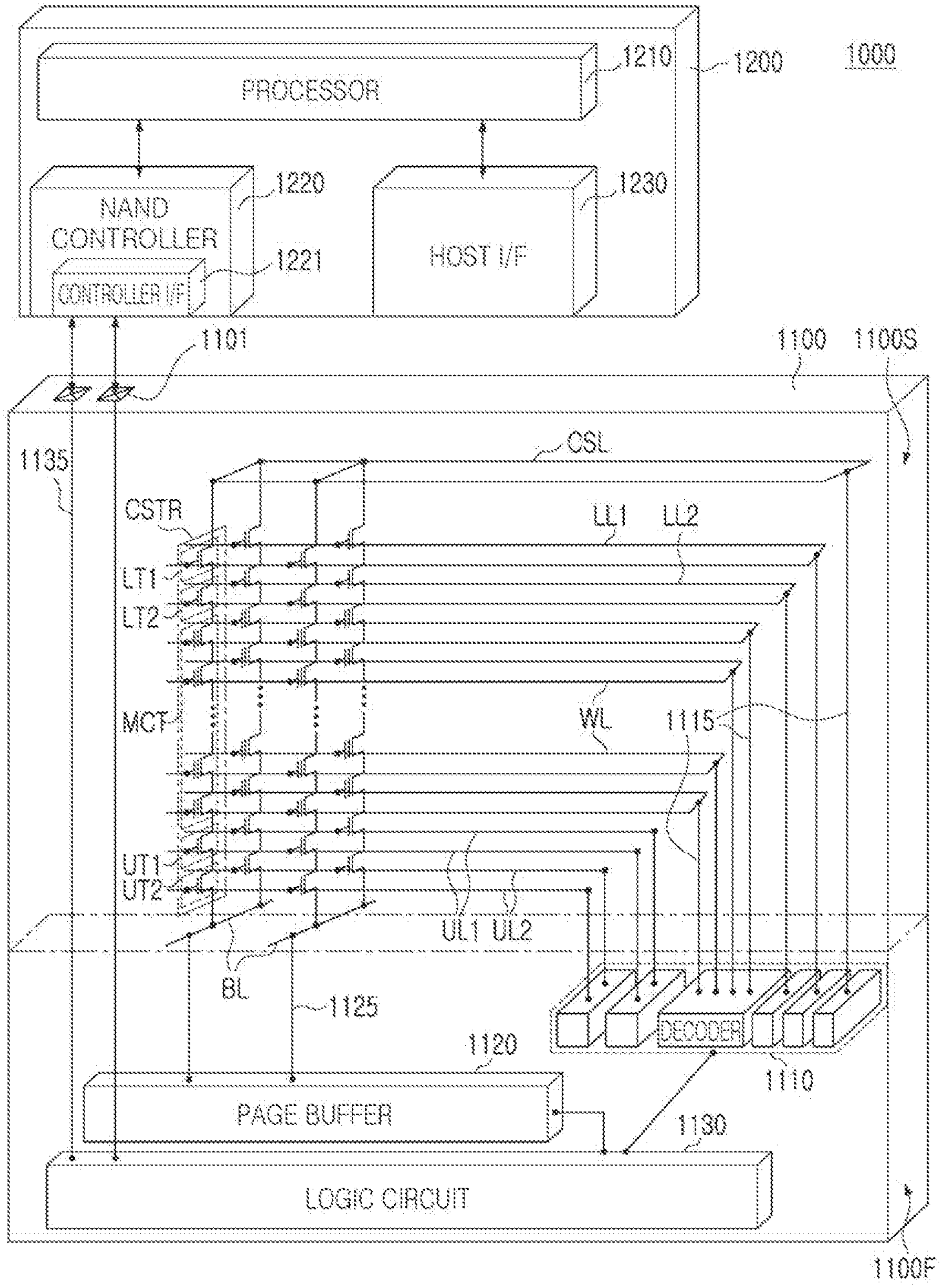
FIG. 24 is a diagram illustrating an electronic system including a semiconductor device according to an example embodiment.

FIG. 24 is a perspective diagram illustrating an electronic system including a semiconductor device according to an example embodiment.

Referring to FIG. 24, an electronic system 1000 may include a semiconductor device 1100 and a controller 1200 electrically connected to the semiconductor device 1100. The electronic system 1000 may be implemented as a storage device including one or a plurality of semiconductor devices 1100 or an electronic device including a storage device. For example, the electronic system 1000 may be implemented as a solid state drive device (SSD) including one or a plurality of semiconductor devices 1100, a universal serial bus (USB), a computing system, a medical device, or a communication device.

The semiconductor device 1100 may be implemented as a non-volatile memory device, such as, for example, the NAND flash memory device described above with reference to FIGS. 1 to 13. The semiconductor device 1100 may include a first structure 1100F and a second structure 1100S on the first structure 1100F. In example embodiments, the first structure 1100F may be disposed on the side of the second structure 1100S. The first structure 1100F may be implemented as a peripheral circuit structure including a decoder circuit 1110, a page buffer 1120, and a logic circuit 1130. The second structure 1100S may be implemented as a memory cell structure including a bit line BL, a common source line CSL, word lines WL, first and second gate upper lines UL1 and UL2, first and second gate lower lines LL1 and LL2 and memory cell strings CSTR disposed between the bit line BL and the common source line CSL.

In the second structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT disposed between the lower transistors LT1 and LT2 and the upper transistors UT1 and UT2. The number of lower transistors LT1 and LT2 and the number of upper transistors UT1 and UT2 may be varied in example embodiments.

In example embodiments, the upper transistors UT1 and UT2 may include a string select transistor, and the lower transistors LT1 and LT2 may include a ground select transistor. The gate lower lines LL1 and LL2 may be configured as gate electrodes of the lower transistors LT1 and LT2, respectively. The word lines WL may be configured as gate electrodes of the memory cell transistors MCT, and the gate upper lines UL1 and UL2 may be configured as gate electrodes of the upper transistors UT1 and UT2, respectively.

In example embodiments, the lower transistors LT1 and LT2 may include a lower erase control transistor LT1 and a ground select transistor LT2 connected to each other in series. The upper transistors UT1 and UT2 may include a string select transistor UT1 and an upper erase control transistor UT2 connected to each other in series. At least one of the lower erase control transistor LT1 and the upper erase control transistor UT1 may be used in an erase operation for erasing data stored in the memory cell transistors MCT using a GIDL phenomenon.

The common source line CSL, the first and second gate lower lines LL1 and LL2, the word lines WL, and the first and second gate upper lines UL1 and UL2 may be electrically connected to the decoder circuit 1110 through first connection wires 1115 extending from the first structure 1100F to the second structure 1100S. The bit lines BL may be electrically connected to the page buffer 1120 through second connection wires 1125 extending from the first structure 110F to the second structure 1100S.

In the first structure 1100F, the decoder circuit 1110 and the page buffer 1120 may perform a control operation on at least one selected memory cell transistor among the plurality of memory cell transistors MCT. The decoder circuit 1110 and the page buffer 1120 may be controlled by the logic circuit 1130. The semiconductor device 1000 may communicate with the controller 1200 through the input/output pad 1101 electrically connected to the logic circuit 1130. The input/output pad 1101 may be electrically connected to the logic circuit 1130 through an input/output connection line 1135 extending from the first structure 1100F to the second structure 1100S.

The controller 1200 may include a processor 1210, a NAND controller 1220, and a host interface 1230. In example embodiments, the electronic system 1000 may include a plurality of semiconductor devices 1100, and in this case, the controller 1200 may control the plurality of semiconductor devices 1000.

The processor 1210 may control overall operation of the electronic system 1000 including the controller 1200. The processor 1210 may operate according to a predetermined firmware, and may access the semiconductor device 1100 by controlling the NAND controller 1220. The NAND controller 1220 may include a NAND interface 1221 processing communication with the semiconductor device 1100. Through the NAND interface 1221, a control command for controlling the semiconductor device 1100, data to be written to the memory cell transistors MCT of the semiconductor device 1100, and data to be read from the memory cell transistors MCT of the semiconductor device 1100 may be transmitted. The host interface 1230 may provide a communication function between the electronic system 1000 and an external host. When a control command from an external host is received through the host interface 1230, the processor 1210 may control the semiconductor device 1100 in response to the control command.

Figure 25:
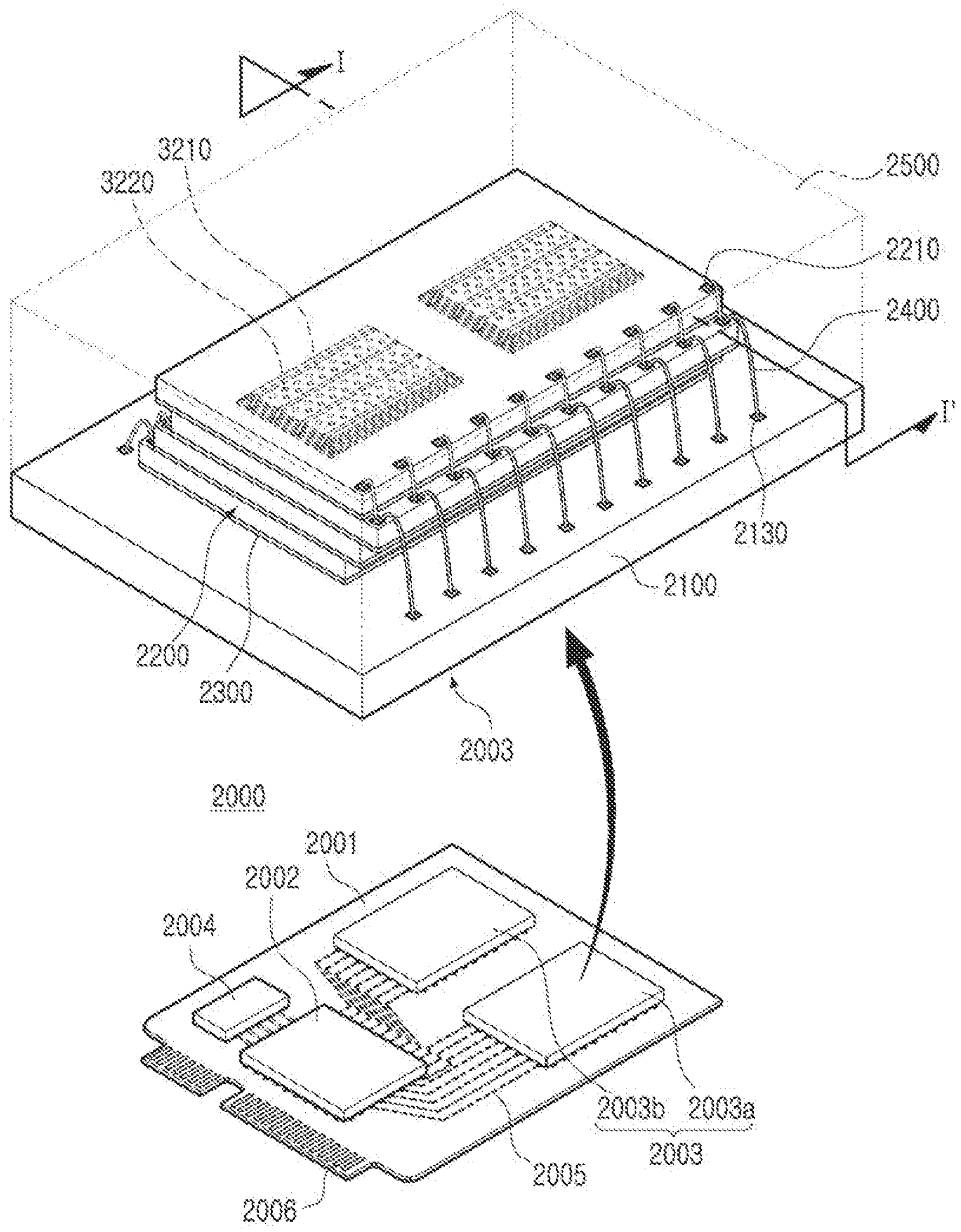
FIG. 25 is a perspective diagram illustrating an electronic system including a semiconductor device according to an example embodiment and FIG. 26 is a cross-sectional diagram illustrating a semiconductor package according to an example embodiment.

FIG. 25 is a perspective diagram illustrating an electronic system including a semiconductor device according to an example embodiment.

Referring to FIG. 25, an electronic system 2000 in an example embodiment may include a main board 2001, a controller 2002 mounted on the main board 2001, one or more semiconductor packages 2003, and a DRAM 2004. The semiconductor package 2003 and the DRAM 2004 may be connected to the controller 2002 by wiring patterns 2005 formed on the main board 2001.

The main board 2001 may include a connector 2006 including a plurality of pins coupled to an external host. The number and arrangement of the plurality of pins in the connector 2006 may vary depending on a communication interface between the electronic system 2000 and the external host. In example embodiments, the electronic system 2000 may communicate with an external host according to one of interfaces from among universal serial bus (USB), peripheral component interconnect express (PCI-Express), serial advanced technology attachment (SATA), M-Phy for universal flash storage (UFS). In example embodiments, the electronic system 2000 may operate by power supplied from an external host through the connector 2006. The electronic system 2000 may further include a power management integrated circuit (PMIC) for distributing power supplied from the external host to the controller 2002 and the semiconductor package 2003.

The controller 2002 may write data to or may read data from the semiconductor package 2003, and may improve an operating speed of the electronic system 2000.

The DRAM 2004 may be configured as a buffer memory for alleviating a difference in speeds between the semiconductor package 2003, which is a data storage space, and an external host. The DRAM 2004 included in the electronic system 2000 may operate as a cache memory, and may provide a space for temporarily storing data in a control operation for the semiconductor package 2003. When the electronic system 2000 may include the DRAM 2004, the controller 2002 may further include a DRAM controller for controlling the DRAM 2004 in addition to the NAND controller for controlling the semiconductor package 2003.

The semiconductor package 2003 may include first and second semiconductor packages 2003*a* and 2003*b* spaced apart from each other. Each of the first and second semiconductor packages 2003*a* and 2003*b* may be configured as a semiconductor package including a plurality of semiconductor chips 2200. Each of the first and second semiconductor packages 2003*a* and 2003*b* may include a package substrate 2100, semiconductor chips 2200 on the package substrate 2100, adhesive layers 2300 disposed on lower surfaces of the semiconductor chips 2200, respectively, a connection structure 2400 electrically connecting the semiconductor chips 2200 to the package substrate 2100, and a molding layer 2500 covering the semiconductor chips 2200 and the connection structure 2400 on the package substrate 2100.

The package substrate 2100 may be configured as a printed circuit board including package upper pads 2130. Each semiconductor chip 2200 may include an input/output pad 2210. The input/output pad 2210 may correspond to the input/output pad 1101 in FIG. 24. Each of the semiconductor chips 2200 may include gate stack structures 3210 and channel structures 3220. Each of the semiconductor chips 2200 may include the semiconductor device described above with reference to FIGS. 1 to 13.

In example embodiments, the connection structure 2400 may be configured as a bonding wire electrically connecting the input/output pad 2210 to the upper package pads 2130. Accordingly, in each of the first and second semiconductor packages 2003*a* and 2003*b*, the semiconductor chips 2200 may be electrically connected to each other by a bonding wire method, and may be electrically connected to the package upper pads 2130 of the package substrate 2100. In example embodiments, in each of the first and second semiconductor packages 2003*a* and 2003*b*, the semiconductor chips 2200 may be electrically connected to each other by a connection structure including a through-electrode (TSV) instead of the connection structure 2400 of a bonding wire method.

In example embodiments, the controller 2002 and the semiconductor chips 2200 may be included in a single package. In an example embodiment, the controller 2002 and the semiconductor chips 2200 may be mounted on a separate interposer substrate different from the main substrate 2001, and the controller 2002 and the semiconductor chips 2200 may be connected to each other wiring formed on the interposer substrate.

Figure 26:
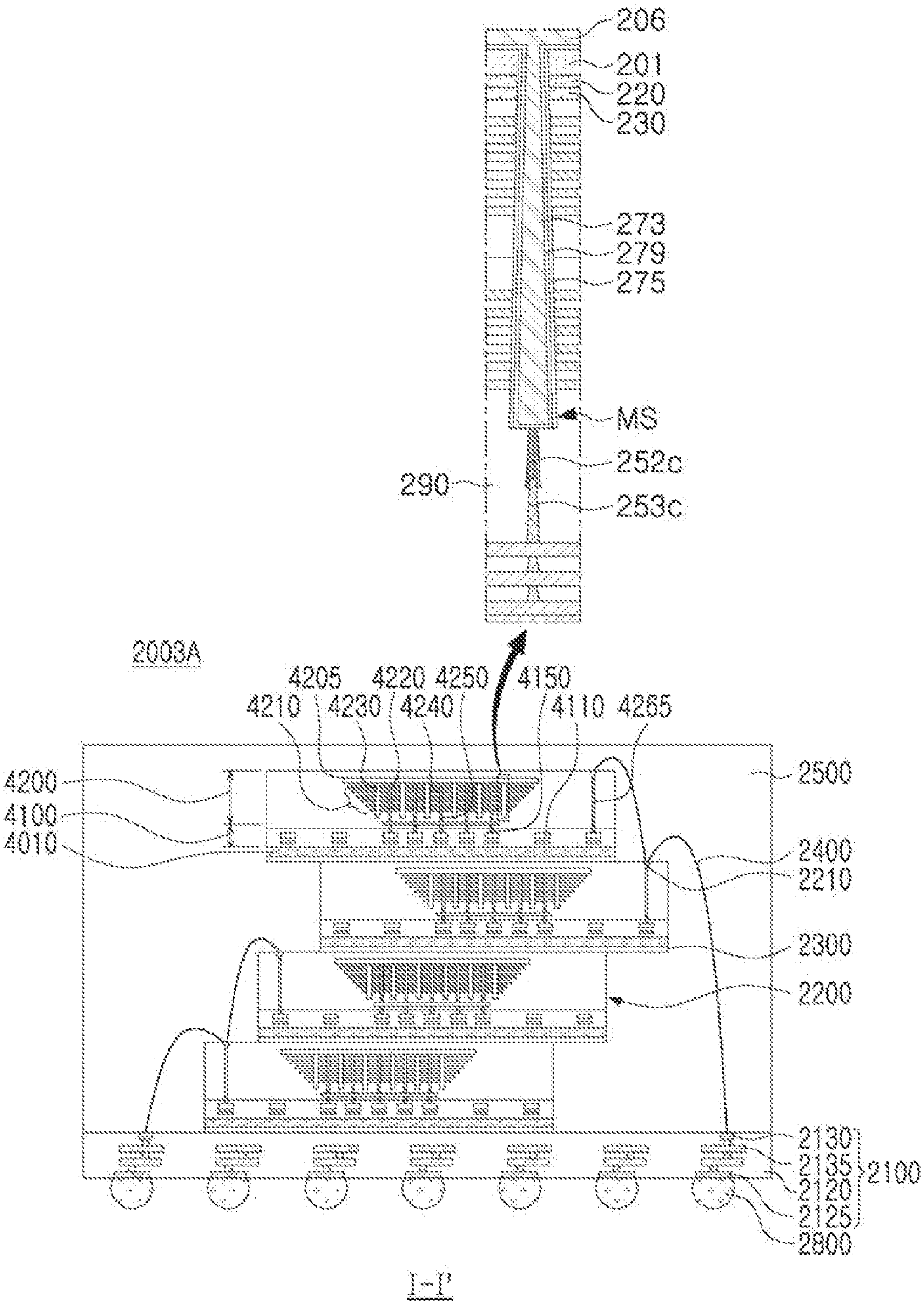

FIG. 26 is a cross-sectional diagram illustrating a semiconductor package according to an example embodiment, illustrating an example embodiment of the semiconductor package 2003 in FIG. 25 taken along line I-I'.

Referring to FIG. 26, in the semiconductor package 2003A, each of the semiconductor chips 2200*a* may include a semiconductor substrate 4010, a first semiconductor structure 4100 on the semiconductor substrate 4010, and a second semiconductor structure 4200 bonded to the first semiconductor structure 4100 by a wafer bonding method on the first semiconductor structure 4100.

The first semiconductor structure 4100 may include a peripheral circuit region including a peripheral wiring 4110 and a lower bonding structure 4150. The second semiconductor structure 4200 may include a common source line 4205, a gate stack structure 4210 disposed between the common source line 4205 and the first semiconductor structure 4100, channel structures 4220 and an isolation structure 4230 penetrating through the gate stack structure 4210, and an upper bonding structure 4250 electrically connected to the word lines WL (in FIG. 24) of the channel structures 4220 and the gate stack structure 4210, respectively. For example, the upper bonding structure 4250 may be electrically connected to the channel structures 4220 and the word lines WL (in FIG. 24) through the gate contacts 251*a*, 252*a*, and 253*a* (in FIG. 2) electrically connected to the bit lines 4240 and the word lines WL (in FIG. 24). The lower bonding structure 4150 of the first semiconductor structure 4100 and the upper bonding structure 4250 of the second semiconductor structure 4200 may be bonded to and in contact with each other. Bonding portions of the lower bonding structure 4150 and the upper bonding structure 4250 may be formed of, for example, copper (Cu).

As illustrated in the enlarged diagram, the second semiconductor structure 4200 may further include a plate conductive layer 206, a vertical conductive layer 273, and a liner insulating layer 275. Each of the semiconductor chips 2200*a* may further include an input/output pad 2210 and an input/output connection line 4265 disposed below the input/output pad 2210. The input/output connection line 4265 may be electrically connected to a portion of the second bonding structures 4210.

The semiconductor chips 2200*a* in FIG. 26 may be electrically connected to each other by connection structures 2400 in the form of bonding wires. However, in example embodiments, semiconductor chips in a semiconductor package, such as the semiconductor chips 2200*a* in FIG. 26, may be electrically connected to each other by a connection structure including a through electrode TSV.

According to the aforementioned example embodiments, by disposing the plate conductive layer 206 and the isolation structure MS including the metal material to be electrically connected to the channel layer CH through the second substrate 201, a semiconductor device having improved electrical properties and improved reliability and an electronic system including the same may be provided.

While the example embodiments have been illustrated and described above, it will be configured as apparent to those skilled in the art that modifications and variations may be made without departing from the scope of the present disclosure as defined by the appended claims.

What is claimed is:

1. A semiconductor device comprising:
- a first semiconductor structure including a first substrate, circuit devices disposed on the first substrate, a lower wiring structure electrically connected to the circuit devices, and a lower bonding structure connected to the lower wiring structure; and
- a second semiconductor structure including:
  - a second substrate disposed on the first semiconductor structure,
  - gate electrodes stacked and spaced apart from each other in a vertical direction perpendicular to a lower surface of the second substrate,
  - channel structures that penetrate the gate electrodes, that extend in the vertical direction, and that each include a channel layer,
  - an upper wiring structure disposed below the gate electrodes and below the channel structures,
  - an upper bonding structure connected to the upper wiring structure and bonded to the lower bonding structure,
  - a plate conductive layer disposed on an upper surface of the second substrate, that is electrically connected to the channel layer, and that includes a metal material, and
  - an isolation structure that extends in the vertical direction, that penetrates an entirety of the gate electrodes, and that has a width in a horizontal direction perpendicular to the vertical direction,
- wherein the isolation structure includes a vertical conductive layer that extends from the plate conductive layer, that is integrated with the plate conductive layer, and that includes a same metal material as the metal material of the plate conductive layer.

2. The semiconductor device of claim 1, wherein the upper wiring structure further includes a source contact that is disposed below the vertical conductive layer, connected to the vertical conductive layer, and electrically connected to the plate conductive layer.

3. The semiconductor device of claim 1, wherein the isolation structure further includes a liner insulating layer that surrounds an external side surface of the vertical conductive layer.

4. The semiconductor device of claim 1, wherein the metal material includes at least one of tungsten (W), copper (Cu), or aluminum (Al).

5. The semiconductor device of claim 1, wherein the second substrate includes a doped semiconductor material.

6. The semiconductor device of claim 1, wherein a level of the upper surface of the second substrate is substantially the same as a level of upper surfaces of the channel structures.

7. The semiconductor device of claim 3,
- wherein the second semiconductor structure further includes interlayer insulating layers alternately stacked with the gate electrodes, and
- wherein portions of the liner insulating layer protrude toward the interlayer insulating layers in a region of the liner insulating layer that is in contact with the interlayer insulating layers.

8. The semiconductor device of claim 3, wherein the width of an upper region of the isolation structure in the horizontal direction is greater than the width of a lower region of the isolation structure.

9. The semiconductor device of claim 8, wherein the isolation structure further includes an insulating layer surrounding at least a portion of an external side surface of the liner insulating layer.

10. The semiconductor device of claim 1, wherein a lower portion of the vertical conductive layer has a recess region.

11. The semiconductor device of claim 1, wherein the channel structures further include a gate dielectric layer disposed between the channel layer and the gate electrodes and between the channel layer and the second substrate, and wherein the second semiconductor structure further includes a horizontal conductive layer that is disposed between the second substrate and the gate electrodes, that penetrates the gate dielectric layer, and that is in direct contact with the channel layer.

12. The semiconductor device of claim 11, wherein the vertical conductive layer is electrically connected to the channel layer through the plate conductive layer, the second substrate, and the horizontal conductive layer.

13. The semiconductor device of claim 1, wherein the second semiconductor structure further comprises:

a pad auxiliary layer that is spaced apart from the plate conductive layer, a level of the pad auxiliary layer being the same as a level of the plate conductive layer;

a conductive pad that is connected to an upper portion of the pad auxiliary layer; and a contact plug that is connected to a lower portion of the pad auxiliary layer.

* * * * *